(12) United States Patent
Gupta et al.

(10) Patent No.: US 10,910,798 B2
(45) Date of Patent: Feb. 2, 2021

(54) APPARATUS AND METHOD FOR IGNITION OF A PLASMA SYSTEM AND FOR MONITORING HEALTH OF THE PLASMA SYSTEM

(71) Applicant: MKS Instruments, Inc., Andover, MA (US)

(72) Inventors: Atul Gupta, Andover, MA (US); Colin Sanford, Andover, MA (US); Joshua Lamontagne, Andover, MA (US); Kevin Wenzel, Andover, MA (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 16/682,693

(22) Filed: Nov. 13, 2019

(65) Prior Publication Data
US 2020/0099199 A1   Mar. 26, 2020

Related U.S. Application Data

(63) Continuation of application No. 15/705,643, filed on Sep. 15, 2017, now Pat. No. 10,505,348.

(51) Int. Cl.
*H01T 23/00* (2006.01)
*B08B 9/032* (2006.01)
*H01J 37/32* (2006.01)

(52) U.S. Cl.
CPC ............ *H01T 23/00* (2013.01); *B08B 9/0328* (2013.01); *H01J 37/321* (2013.01); *H01J 37/3299* (2013.01); *H01J 37/32174* (2013.01); *H01J 37/32935* (2013.01)

(58) Field of Classification Search
None
See application file for complete search history.

(56) References Cited

U.S. PATENT DOCUMENTS

| | | | |
|---|---|---|---|
| 5,658,423 A * | 8/1997 | Angell | H01J 37/32082 204/192.13 |
| 5,791,890 A * | 8/1998 | Maughan | F24C 3/128 431/6 |
| 5,886,865 A | 3/1999 | Parkhe et al. | |

(Continued)

FOREIGN PATENT DOCUMENTS

WO   2010098779 A1   9/2010

OTHER PUBLICATIONS

International Search Report and Written Opinion in corresponding International Application No. PCT/US2018/047965, dated Dec. 7, 2018.

*Primary Examiner* — Jas A Sanghera
(74) *Attorney, Agent, or Firm* — Burns & Levinson, LLP; Joseph M. Maraia; Steven M. Mills

(57) ABSTRACT

An apparatus and method for determining the health of a plasma system by igniting a plasma within a plasma confining volume generate an ignition signal with an ignition circuit and apply the ignition signal between a biased region and a grounded region in the vicinity of the plasma confining volume. A parameter in the ignition circuit is sensed, and the sensed parameter is compared to a first parameter threshold. A condition associated with the plasma confining volume is determined if the sensed parameter differs from the first voltage threshold, and a corrective action can be taken.

16 Claims, 22 Drawing Sheets

(56) References Cited

U.S. PATENT DOCUMENTS

| | | | |
|---|---|---|---|
| 5,982,099 A * | 11/1999 | Barnes | H05H 1/36 315/111.21 |
| 6,039,849 A * | 3/2000 | Paulson | C23C 14/34 118/723 E |
| 6,872,909 B2 | 3/2005 | Holber et al. | |
| 9,275,839 B2 | 3/2016 | Chen et al. | |
| 2007/0235060 A1 | 10/2007 | Takizawa et al. | |
| 2010/0026186 A1 | 2/2010 | Forrest et al. | |
| 2012/0280618 A1 | 11/2012 | Utano | |
| 2014/0214395 A1 * | 7/2014 | Valcore, Jr. | G06F 30/36 703/14 |
| 2014/0346952 A1 | 11/2014 | Choi | |
| 2016/0032451 A1 * | 2/2016 | Kurita | C23C 16/452 134/1.1 |

* cited by examiner

APPARATUS AND METHOD FOR IGNITION OF A PLASMA SYSTEM AND FOR MONITORING HEALTH OF THE PLASMA SYSTEM

RELATED APPLICATION

This application is a continuation of U.S. application Ser. No. 15/705,643, filed Sep. 15, 2017, entitled "Apparatus and Method for Ignition of a Plasma System and for Monitoring Health of the Plasma System," the contents of which is incorporated by reference herein in its entirety for all purposes.

BACKGROUND

1. Technical Field

The present disclosure is related to plasma sources and, in particular, to an apparatus and method for ignition of plasma sources and for providing fault diagnostics of a plasma source using monitoring of a plasma ignition procedure.

2. Discussion of Related Art

Ignition of plasma in an inductively coupled plasma (ICP) source or a transformer coupled plasma (TCP) source typically involves application of a high-voltage pulse within the plasma vessel to create an initial breakdown of the gas into ionized state that then generates the plasma. The time duration and magnitude of the high voltage pulse are typically fixed at some predetermined values designed to achieve plasma breakdown at the preferred operating conditions. Conventional ignition schemes are designed to deliver the highest practical pulse voltage to break down the gas and create a plasma. In some cases, this approach can apply unnecessary stress on the electronics and also applies unnecessarily high electric fields across the biased plasma blocks.

In conventional plasma sources, a higher ignition voltage is chosen to account for unfavorable gas conditions which might inhibit the ignition. These unfavorable conditions can include, for example, high gas pressure, low gas flow, or poisoning, i.e., the presence of contaminants in the gas, or a lack of sufficient electron density to create an initial plasma breakdown. The high ignition voltage results in a high electric field that in turn increases the probability of creating an avalanche breakdown of the gas where a few electrons in the high-field region gain sufficient energy to ionize the gas molecules, thereby releasing more electrons in the high-field region, leading to the avalanche breakdown of the gas. In such conventional systems, with this voltage adjustment implemented, even in favorable gas conditions, the high-voltage is applied, which can wear the electronics more quickly, and can increase the chances of arcing inside the plasma vessel. The high-voltage ignition pulse train can lead to arcing and degradation, which in turn generates particulate defects that could reduce the yield of high performance chips in advanced semiconductor processing applications.

SUMMARY

According to a first aspect, a method of determining the health of a plasma system by igniting a plasma within a plasma confining volume is provided. The method includes generating an ignition signal with an ignition circuit and applying the ignition signal between a biased region and a grounded region in the vicinity of the plasma confining volume. A parameter in the ignition circuit is sensed, and the sensed parameter is compared to a first parameter threshold. A condition associated with the plasma confining volume is determined if the sensed parameter differs from the first voltage threshold.

In some exemplary embodiments, the condition is contamination of gases in the plasma confining volume. In some exemplary embodiments, the condition is insufficient free electron density for ignition of plasma. The determined condition can be reported, and a corrective action associated with the determined condition can be taken. In some exemplary embodiments, the corrective action includes checking for a contaminant in a feed gas and eliminating a source of the contaminant. In some exemplary embodiments, the corrective action includes providing a purge gas through the plasma confining volume to reduce an amount of a contaminant in the plasma confining volume.

In some exemplary embodiments, the method further includes determining a breakdown time, the breakdown time being an amount of time between a time at which the ignition signal is applied and a time at which the sensed parameter changes relative to a second parameter threshold. In some exemplary embodiments, the method further includes determining a condition associated with the plasma confining volume if the breakdown time exceeds a breakdown time threshold. In some exemplary embodiments, the condition is contamination of gases in the plasma confining volume. In some exemplary embodiments, the condition is insufficient free electron density for ignition of plasma.

In some exemplary embodiments, the sensed parameter in the ignition circuit is a voltage in the ignition circuit. In some exemplary embodiments, the sensed parameter in the ignition circuit is a current in the ignition circuit.

According to a second aspect, an apparatus for determining the health of a plasma system by igniting a plasma within a plasma confining volume is provided. An ignition circuit generates an ignition signal. An input applies the ignition signal between a biased region and a grounded region in the vicinity of the plasma confining volume. A sensor senses a parameter in the ignition circuit. A processing unit compares the sensed parameter to a first parameter threshold and determines a condition associated with the plasma confining volume if the sensed parameter differs from the first parameter threshold.

In some exemplary embodiments, the condition is contamination of gases in the plasma confining volume. In some exemplary embodiments, the condition is insufficient free electron density for ignition of plasma. The determined condition can be reported by the processing circuit, and the processing circuit can take a corrective action associated with the determined condition. In some exemplary embodiments, the corrective action includes checking for a contaminant in a feed gas and eliminating a source of the contaminant. In some exemplary embodiments, the corrective action includes providing a purge gas through the plasma confining volume to reduce an amount of a contaminant in the plasma confining volume.

In some exemplary embodiments, the processing circuit determines a breakdown time, the breakdown time being an amount of time between a time at which the ignition signal is applied and a time at which the sensed parameter changes relative to a second parameter threshold. In some exemplary embodiments, the processing circuit determines a condition associated with the plasma confining volume if the breakdown time exceeds a breakdown time threshold. In some exemplary embodiments, the condition is contamination of gases in the plasma confining volume. In some exemplary embodiments, the condition is insufficient free electron density for ignition of plasma.

In some exemplary embodiments, the parameter sensed by the sensor is a voltage in the ignition circuit. In some exemplary embodiments, the parameter sensed by the sensor is a current in the ignition circuit.

BRIEF DESCRIPTION OF THE DRAWINGS

The present disclosure is further described in the detailed description which follows, in reference to the noted plurality of drawings by way of non-limiting examples of embodiments of the present disclosure, in which like reference numerals represent similar parts throughout the several views of the drawings.

DETAILED DESCRIPTION OF PREFERRED EMBODIMENTS

The present disclosure is directed to an approach to ignition of plasma in a plasma source. In exemplary embodiments as described herein, the plasma source is a toroidal plasma source. It will be understood that the present disclosure is also applicable to other plasma source configurations. The plasma source of the present disclosure is of the type described in U.S. Pat. Nos. 6,872,909 and 9,275,839, the contents of which are incorporated herein in their entirety by reference.

Figure 1:
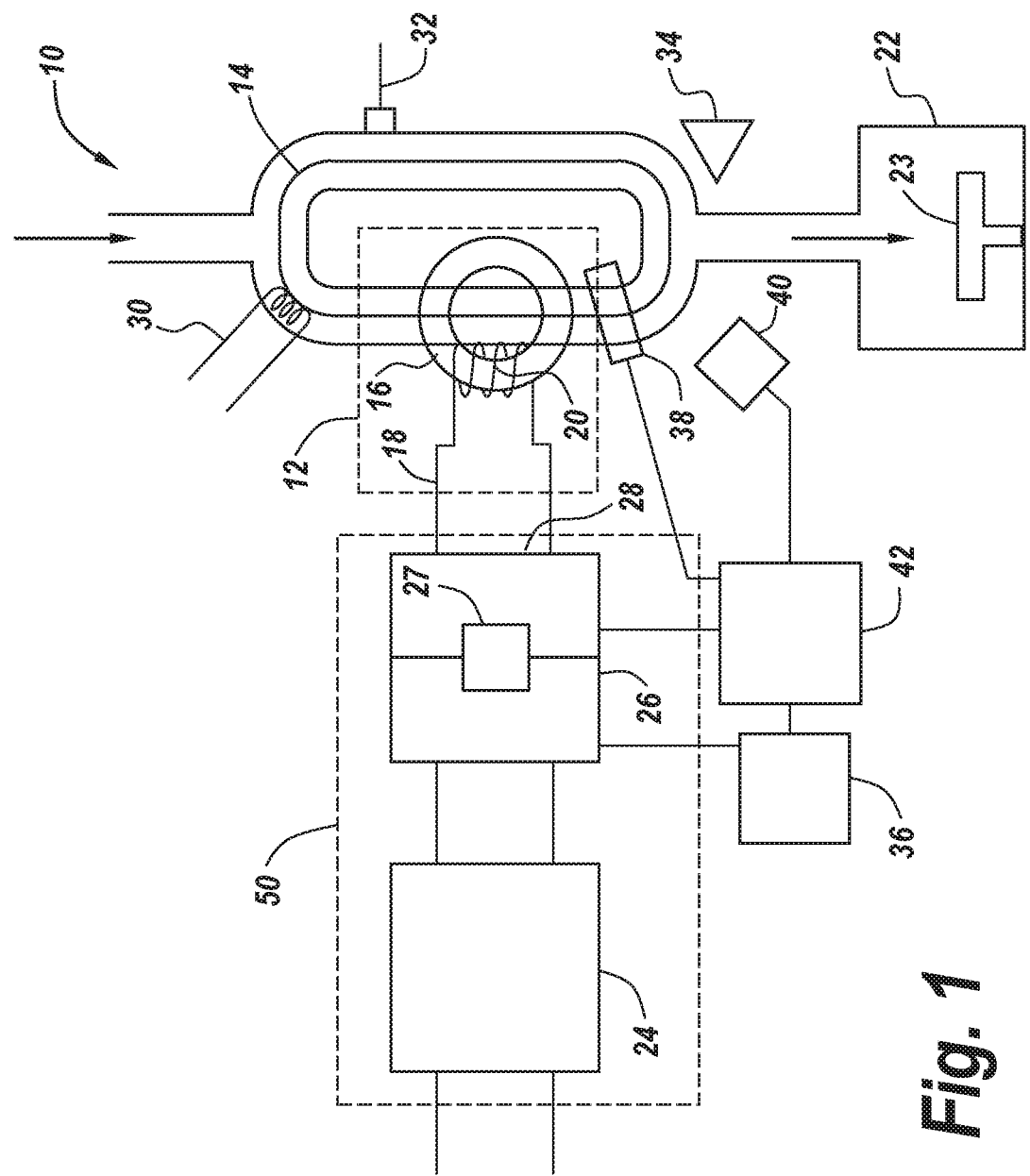
FIG. 1 includes a schematic functional block diagram of a toroidal transformer-coupled plasma source for producing activated gases, to which the present disclosure is directed.

FIG. 1 includes a schematic functional block diagram of a toroidal plasma source 10 for producing activated gases, to which the present disclosure is directed. Source 10 includes a power transformer 12 which couples electromagnetic energy into a plasma 14. The power transformer 12 includes a high-permeability magnetic core 16, a primary coil 18, and a plasma chamber 20. The plasma chamber 20 allows the plasma 14 to form a secondary coil of the transformer 12. The power transformer 12 can include additional magnetic cores and conductor coils (not shown) which form additional primary or secondary coils.

The plasma chamber 20 can be formed from a metallic material such as aluminum or a refractory metal, a coated metal such as anodized aluminum, or can be formed from a dielectric material such as quartz, sapphire, pressed alumina, or other dielectrics. One or more sides of the plasma chamber 20 can be exposed to a process chamber 22 to allow reactive particles (radicals) generated by the plasma 14 to be in direct contact with a material or surfaces to be processed (not shown). Alternatively, the plasma chamber 20 can be located at a distance from the process chamber 22, allowing activated radicals to flow to the process chamber 22 while charged particles recombine during the gas transport. A sample holder 23 can be positioned in the process chamber 22 to support the material to be processed. The material to be processed can be biased relative to the potential of the plasma. Alternatively the reactive particles generated in the plasma source may be used to react with the materials comprising the process chamber to remove any undesired deposits in the process chamber. The reactive particles may also be utilized to generate other molecules through reactions with other gases introduced downstream of the plasma source (in the plasma chamber). In other instances, the reactive particles generated in the plasma source may be used to react with and remove undesired deposits in other components besides the processing chamber, such as gas delivery lines, pump forelines, valves, etc., that may accumulate unwanted deposits over time.

Plasma source 10 also comprises a RF power supply 50. In some embodiments, the switching power supply 50 includes a voltage supply 24 directly coupled to a switching circuit 26 containing a switching semiconductor device 27. The voltage supply 24 can be a line voltage supply or a bus voltage supply. The switching semiconductor device 27 can be a set of switching transistors. The switching circuit 26 can be a solid state switching circuit. An output 28 of the circuit 26 can be directly coupled to the primary winding 18 of the transformer 12.

The toroidal plasma source 10 can include a means for accelerating the free charges that provides an initial breakdown event that ignites a plasma in the plasma chamber 20. The initial ionization event can be a short, high-voltage pulse, which is applied to the plasma chamber 20. The pulse can have a voltage of approximately 500-50,000 volts and can be approximately 0.1 microsecond to 1000 milliseconds in duration. A continuous RF voltage of 500-10,000 volts can also be used to produce the initial ionization event, and the voltage is disconnected after gas breaks down. A gas with low ionization potential such as argon, Neon or Xenon may be introduced into the plasma chamber 20 to reduce the voltage required to ignite the plasma. Ultraviolet radiation may also be used to aid the creation of free charges in the plasma chamber 20 that provide the initial ionization event that ignited the plasma in the plasma chamber 20.

In some embodiments, the high-voltage pulse is applied to an electrode 30 positioned in the plasma chamber 20. It is noted that the electrode does not necessarily need to be inside the plasma chamber. Rather, the electrode need only couple the energy (high voltage) into the gas inside the plasma chamber. For example, the energy may be coupled into the gas through a window made of a material such as sapphire. In some embodiments, the short-duration, high-voltage pulse is applied to an electrode 32 that is capacitively coupled to the plasma chamber 20 through a dielectric. In other embodiments, the plasma chamber 20 is exposed to high-energy radiation emitted from a source such as an ultraviolet light source or laser 34 that is optically coupled to the plasma chamber 20. The radiation causes the initial ionization event that ignites the plasma. In yet another embodiment, the high-voltage pulse may be applied to an electrically isolated portion of the plasma chamber where the electrically biased region is isolated from the adjacent grounded regions through a gap or dielectric insulation separating the two.

The toroidal low-field plasma source 10 can also include a circuit 36 for measuring electrical parameters of the primary winding 18. Electrical parameters of the primary winding 18 include the current driving the primary winding 18, the voltage across the primary winding 18, the bus or line voltage supply generated by the voltage supply 24, the impedance of the primary winding 18, the average power in the primary winding 18, and the peak power in the primary winding 18.

In addition, the plasma source 10 can include a means for measuring relevant electrical parameters of the plasma 14. Relevant electrical parameters of the plasma 14 include the plasma current, loop voltage, impedance, and/or power. For example, the source 10 can include a current probe 38 positioned around the plasma chamber 20 to measure the plasma current flowing in secondary of the transformer 12. The plasma source 10 can also include an optical detector 40 for measuring the optical emission from the plasma 14. In addition, the plasma source 10 can include a power control circuit 42 that accepts data from one or more of the current probe 38, the power detector 40, and the circuitry 26, and then adjusts the power in the plasma by adjusting the current in the primary winding 18.

In operation, a gas is flowed into the plasma chamber 20 until a pressure substantially between 1 millitorr and 100 torr is reached. The gas can comprise a noble gas, a reactive gas or a mixture of at least one noble gas and at least one reactive gas. The circuit 26 containing switching semiconductor devices supplies a current to the primary winding 18 that induces a potential inside the plasma chamber 20. The magnitude of the induced potential depends on the magnetic field produced by the core according to Faraday's law of induction and the frequency at which the switching semiconductor devices operate. An ionization cascade event that forms the plasma can be initiated in the chamber. The ionization event can be the application of a voltage pulse to the electrode 30 in the chamber 20 or to the electrode 32 that is capacitively coupled to the plasma chamber 20. Alternatively, the ionization event can be exposing the chamber 20 to high-energy radiation.

Figure 2:
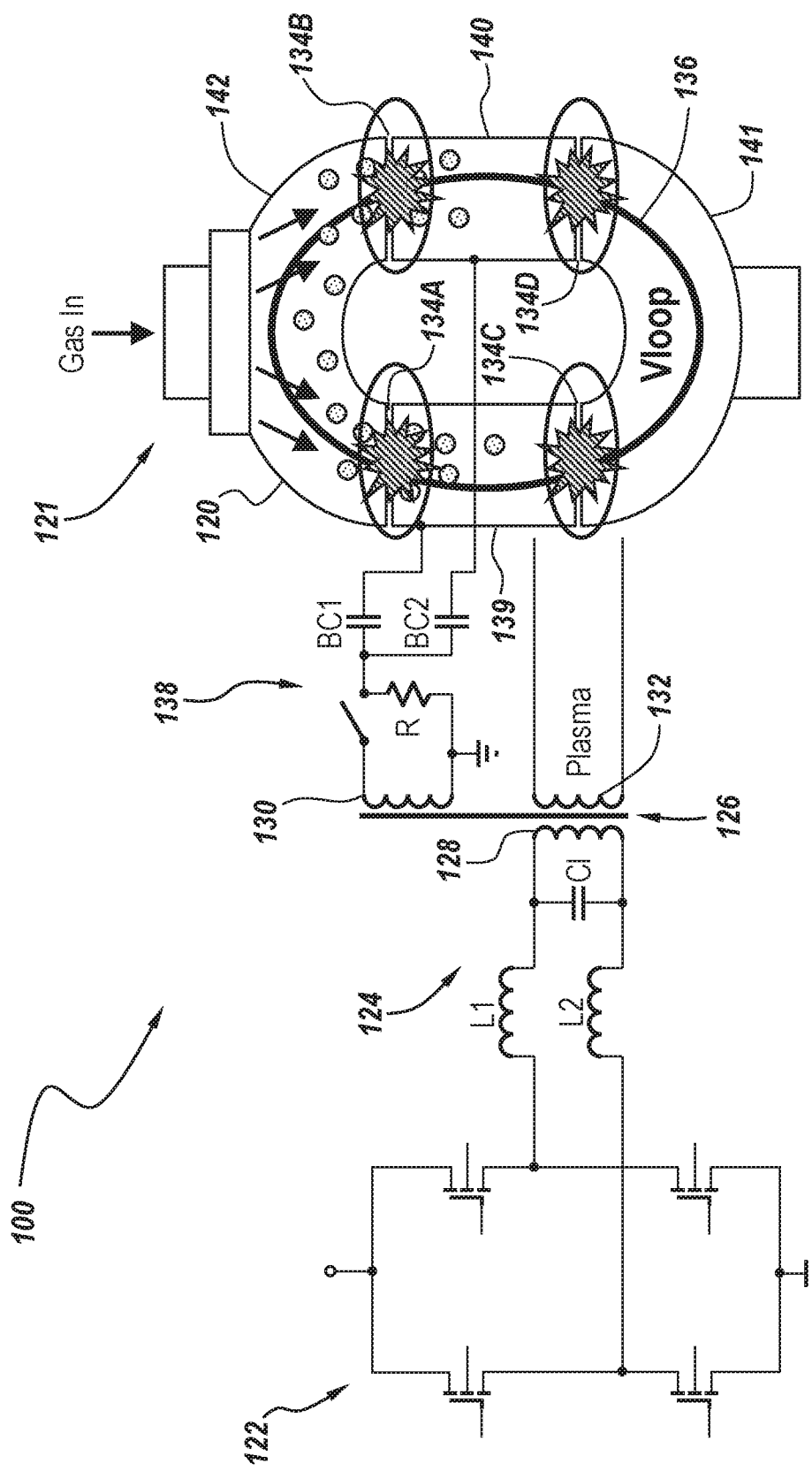
FIG. 2 includes a schematic functional block diagram of a system including a plasma source of the type illustrated in FIG. 1, which includes a toroidal plasma tube, block, or plasma confining region, in which a plasma is ignited, according to some exemplary embodiments.

FIG. 2 includes a schematic functional block diagram of a system 100 including a plasma source 121 of the type illustrated in FIG. 1, which includes a toroidal plasma tube or block 120, also referred to herein as a plasma confining region 120, in which a plasma is ignited, according to the present disclosure. A total potential drop around the entire block loop 136 is referred to herein as VLoop. VLoop is a function of the voltage across the primary coil. In a typical toroidal plasma source, the loop voltage may be allowed to vary with the gas operating pressure, as the impedance of the plasma will change in accordance with different operating conditions. The loop potential may also be changed as desired by changing the plasma current setpoint for a given gas, flow and pressure condition. Plasma confining region 120 includes one or more, e.g., four, dielectric breaks 134A, 134B, 134C, 134D, around the plasma loop. To ignite the plasma in the loop, the ignition voltage, e.g., pulse or series of pulses, referred to herein as VSpark, is applied across one or more of the dielectric breaks 134A, 134B, 134C, 134D. In a successful plasma ignition, sometime after application of the ignition voltage, breakdown occurs, and the plasma ignites and fills the entire loop 136.

FIG. 2 also illustrates the ignition system used to generate the VSpark ignition voltage, according to exemplary embodiments. The ignition system includes an inverter circuit, i.e., switching power supply 122, which generates the initial waveform used to generate VSpark. Alternatively, Vspark may be generated from a different circuit at a different frequency. The signal generated by inverter circuit 122 is applied to resonant circuit 124, which includes inductors L1 and L2 and capacitor C1. Resonant circuit 124 is tuned to have a resonant frequency at the desired plasma excitation voltage VSpark switching frequency. As shown in FIG. 2, capacitor C1 is in parallel with the plasma load. The signal of circuit 124 is applied to the primary winding 128 of a transformer 126. It should be noted that this particular resonant circuit is described as an illustrative exemplary circuit. Other types and configurations of tunable resonant circuits can be used.

A first secondary winding 130 of transformer 126 is applied to a second circuit 138, which delivers the plasma ignition voltage, VSpark (typically higher than the primary loop voltage). To initiate ignition of plasma, the output voltage from circuit 138 is applied to one or more of the biased blocks 139, 140, while the adjacent blocks 141, 142 are grounded. Blocks 139, 140, 141, 142 are electrically conductive blocks, made of a, for example, aluminum, or other such conductive material. Dielectric breaks 134A, 134B, 134C, 134D can be formed as shown between blocks, for example, by coating conductive blocks 139, 140, 141, 142 with a dielectric material, such as, for example, aluminum oxide, or other similar insulating dielectric material. In the particular exemplary illustration of FIG. 2, the output signal from circuit 138, i.e., VSpark, is applied to biased blocks 139 and 140. This creates an electric field across dielectric breaks 134A and 134C due to the voltage difference between biased block 139 and grounded blocks 142 and 141, respectively. Similarly, an electric field is created across dielectric breaks 134B and 134D due to the voltage difference between biased block 140 and grounded blocks 142 and 141, respectively. These electric fields initiate ignition of the plasma in the plasma confining volume within the interior of blocks 139, 140, 141, 142. The plasma loop acts as the second secondary winding 132 of transformer 126 after the plasma loop formation is complete. It should be noted that, even though FIG. 2 shows second secondary winding 132 of transformer 126 adjacent to the transformer core, it is actually the plasma itself formed within the plasma confining volume that serves as second secondary winding 132 of transformer 126. Thus, FIG. 2 schematically illustrates the block ignition according to the present disclosure, showing the two secondary loops that enable VSpark and VLoop to be driven off the same primary coil 128 from transformer 126.

Figure 3:
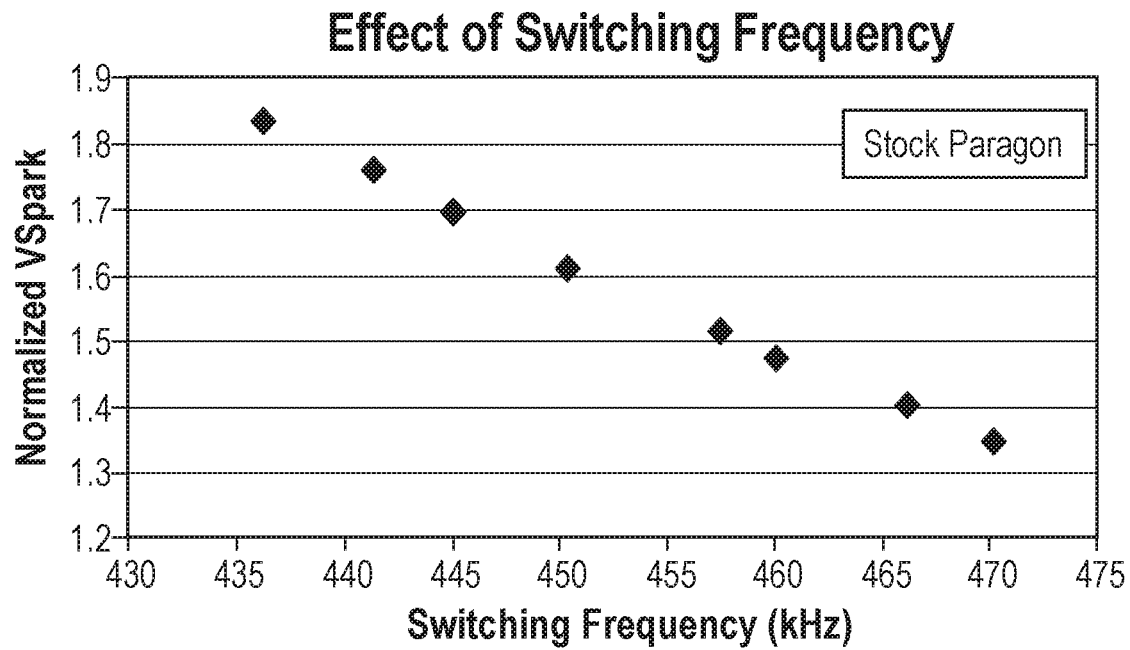
FIG. 3 is a graph illustrating a relationship between the switching frequency and the resulting ignition voltage VSpark, according to some exemplary embodiments.

According to the exemplary embodiments, the voltage during ignition and the resulting plasma breakdown is affected by the switching frequency of the power supply in the resonant switching power supply circuit, including inverter circuit 122, tank circuits 124 and 138 and transformer 126, where the voltage around the primary coils of transformer 126 is controlled by the operating frequency. FIG. 3 is a graph illustrating a relationship between the switching frequency and the resulting ignition voltage VSpark, according to exemplary embodiments. It should be noted that the values for VSpark and Switching Frequency are exemplary only. Referring to FIGS. 2 and 3, the voltage applied for ignition VSpark as well as the plasma loop voltage VLoop are multiples of the primary coil voltage in accordance with the turns ratio of the coils on the respective secondary coils 130, 132 of transformer 126. As the operating frequency of the inverter is changed, e.g., via a gate driver, towards the natural resonant frequency of the circuit (=1/sqrt(LC)), the voltage across primary coil 128 increases toward a maximum, thus correspondingly increasing the voltages on the secondary coils 130, 132 that control the spark and loop voltages VSpark and VLoop (proportional to TurnsRatio*Primary Coil Voltage). As the voltage on the plasma loop and the ignition circuits increases, there is a higher probability of creating a breakdown of the gas creating a plasma. The voltage required to generate the plasma for a given gas flow and pressure is thus indicative of the recombination losses of electrons in the plasma block and hence can serve as a valuable diagnostic for measuring the surface condition of the plasma blocks.

In some exemplary embodiments, VSpark can be tuned by removing capacitors in the ignition circuit to change resonant frequency of the ignition circuit. In one embodiment, a variable VSpark relay could be used in the ignition circuit to remove capacitance and change resonant frequency. In another method, adjustable capacitors similar to those used in RF matching networks could be used to accomplish the same result.

Hence according to the present disclosure, various adjustments and modification can be made to parameters that affect the ignition of plasma. These adjustments and modifications can be made based on the conditions of the particular ignition scenario, such as, for example, a cold-start situation or a poison, i.e., contamination situation. These adjustments can include, for example, one or more of changing the switching frequency of the power supply, i.e., inverter circuit; changing the pulse width of the power supply, i.e., inverter circuit; changing the resonant frequency of the plasma breakdown electronics through modifying the capacitance of the circuit and/or modifying the properties of the inductor used to couple to the plasma; and switching in the different voltage levels via alternative circuits.

Figure 4:
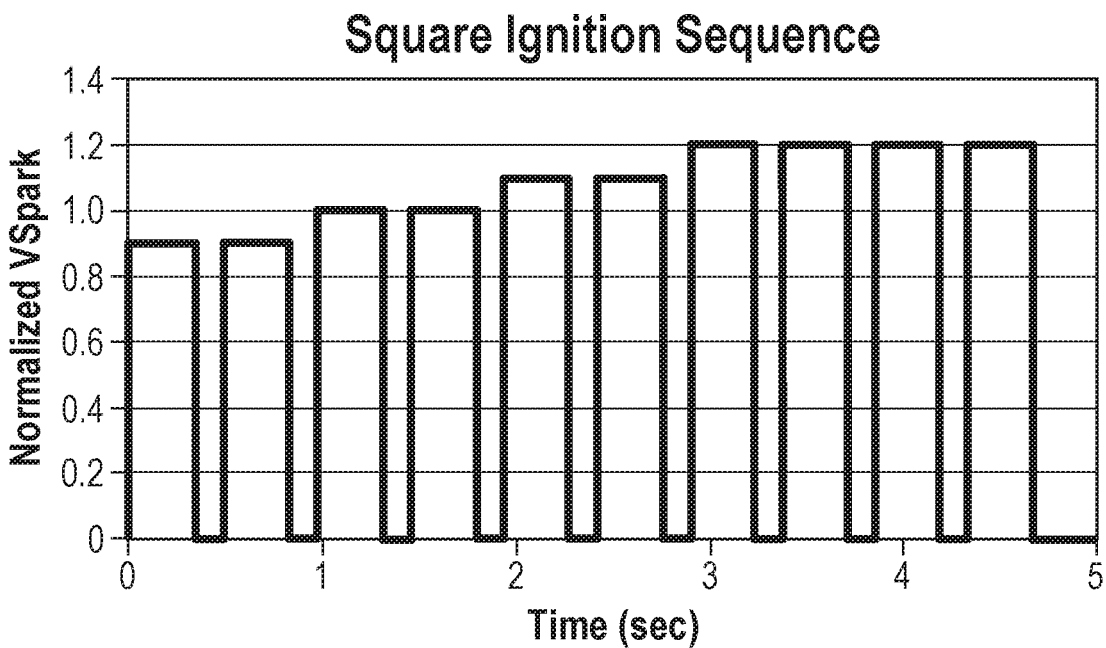
FIG. 4 includes a graph of a waveform for ignition of plasma, having square ignition pulses, according to some exemplary embodiments.

FIG. 4 includes a graph showing the positive peak voltage used for igniting the plasma. The levels represent the peak (positive) value of the spark voltage applied for certain time periods according to exemplary embodiments. It is important to note that the spark voltage may be applied as square alternating pulses switching from positive to negative peak values switching at the RF frequency. This train of pulses may be applied for a given time to enable plasma ignition within that time period. Specifically, FIG. 4 illustrates the timing in seconds of a series of VSpark voltage pulse trains, referred to as Normalized VSpark, showing only the positive half of the Voltage pulse envelope. As illustrated in FIG. 4, as the ignition sequence progresses, in some exemplary embodiments, the voltage across the dielectric break 134 increases. In the particular exemplary sequence illustrated in FIG. 4, in successive pairs of plasma breakdown pulse trains, the voltage across the plasma loop is increased. However, during each pulse train, the peak voltage level is constant. After three successive pairs of pulse trains, the voltage assumes a constant level for subsequent pulse trains.

In some exemplary embodiments, the VSpark signal follows a sinusoidal waveform having an amplitude which swings between the peak positive value illustrated by the pulse train envelope in FIG. 4 to the peak negative value. The repetition rate of the sinusoidal pulses in each pulse train can be approximately 100 to 1000 kHz and typically between 400 and 700 kHz. As noted above, FIG. 4 illustrates only the positive peak voltage of the sinusoidal pulses over a given time period. As illustrated, the voltage value of the positive peak voltage is changed/controlled between consecutive pulse trains.

Figure 5:
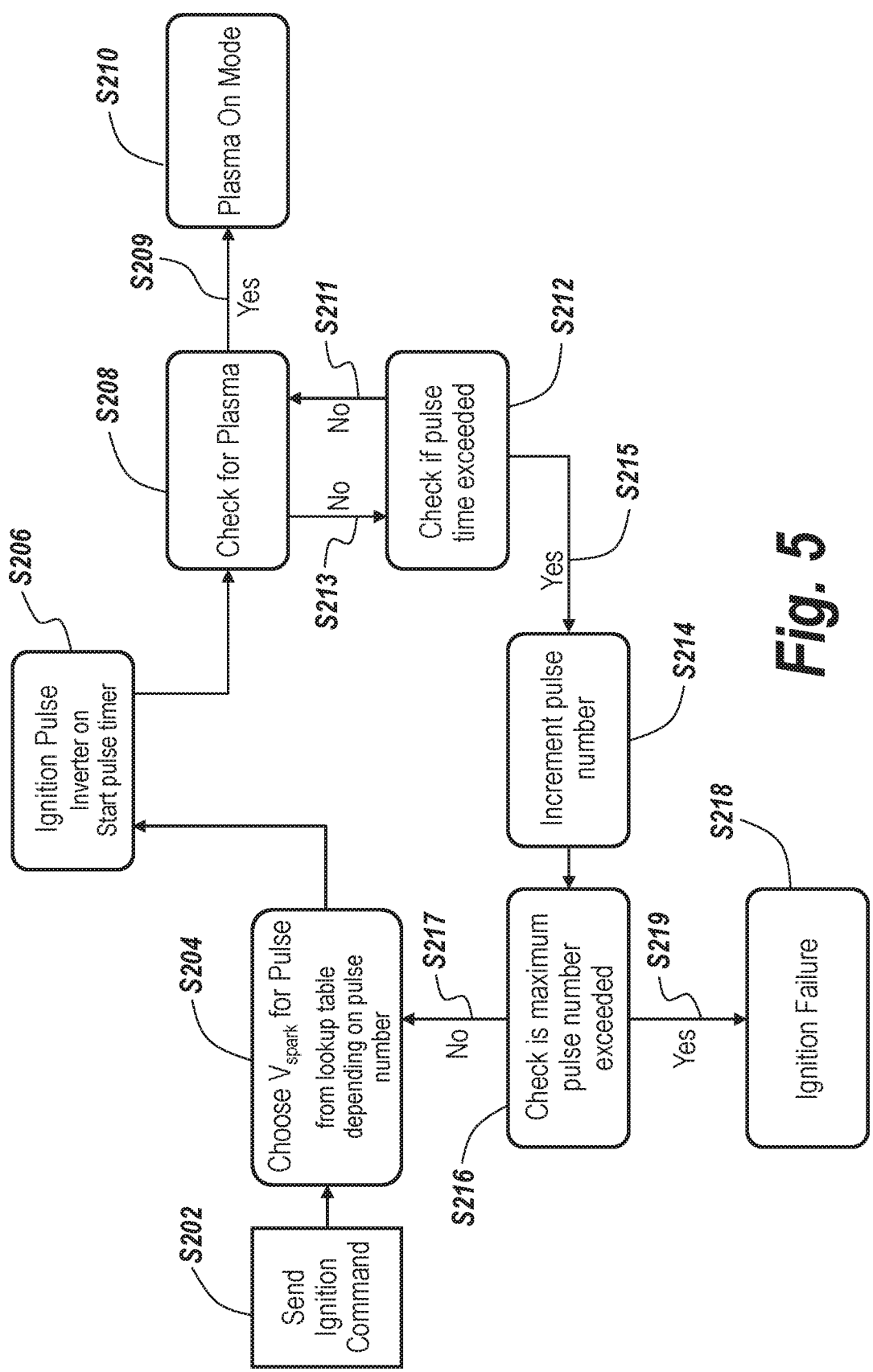
FIG. 5 includes a logical flow diagram illustrating the logical flow of the square ignition sequence of FIG. 4, according to some exemplary embodiments.

FIG. 5 includes a logical flow diagram illustrating the logical flow of the square ignition sequence of FIG. 4, according to some exemplary embodiments. Referring to FIG. 5, a plasma ignition command is generated and transmitted in step S202. Next, a peak voltage level VSpark is chosen for the first pulse train in step S204. The voltages for ignition pulses can be stored in a look-up table, based on various parameters related to the particular plasma generation application. Next, the ignition pulse train is generated in step S206. During this step, inverter circuit 122 is enabled and a pulse timer is started. Next, a check is performed to determine whether plasma has ignited and is being generated in step S208. If so, flow continues to the plasma-on mode in step S210, via Yes branch S209. If not, a check is performed to determine whether the prescribed pulse duration time has been reached in step S212, via No branch S213. If the pulse duration has not been reached, then plasma is checked for in step S208 along No branch S211. This loop checking for plasma until the pulse time duration expires continues via No branches S211 and S213 until the prescribed pulse duration is reached, and the pulse number is incremented in step S214, via Yes branch S215. Next, a check is performed to determine whether the maximum number of pulses has been reached, i.e., whether the last pulse of the VSpark sequence has completed, in step S216. If not, then flow returns along No branch S217 to step S204, at which a voltage for the next pulse in the VSpark waveform is selected. On the other hand, if it is determined in step S216 that the last pulse has been reached, then flow moves to step S218 along Yes branch S219, wherein it is concluded that an ignition failure has occurred.

Figure 6:
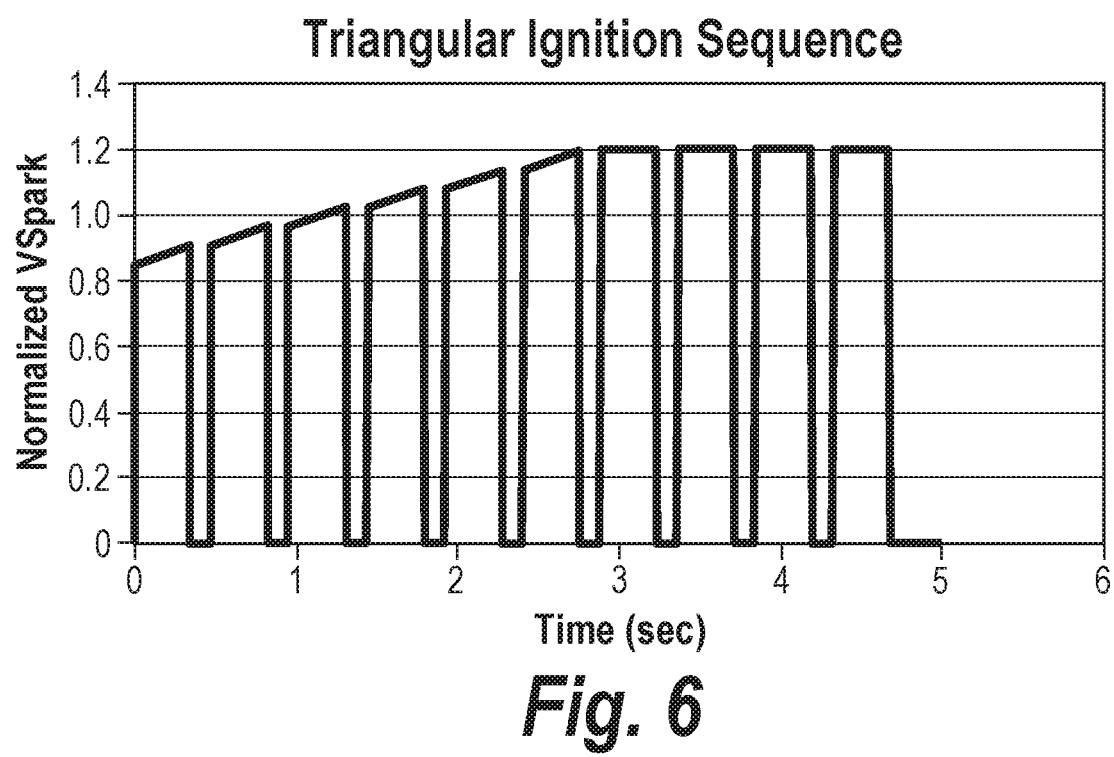
FIG. 6 includes a graph of a waveform for ignition of plasma, having triangular or sloped ignition pulses, according to some exemplary embodiments.

FIG. 6 includes a graph of a waveform for ignition of plasma, having triangular or sloped ignition pulse trains, according to exemplary embodiments. Specifically, FIG. 6 illustrates the timing in seconds of a series of VSpark voltage pulse trains, referred to as Normalized VSpark. The diagram of FIG. 6 is completely analogous to that of FIG. 4, with the difference between the two pulse train envelopes is that the pulse train envelope of FIG. 4 is a "square" ignition pulse train envelope, and the pulse train envelope of FIG. 6 is a "triangular" ignition pulse train envelope. As illustrated in FIG. 6, as the ignition sequence progresses, in some exemplary embodiments, the voltage across the dielectric break 134 increases. In the particular exemplary sequence illustrated in FIG. 6, in successive plasma breakdown pulses the voltage across the plasma loop is increased. Furthermore, in contrast to the square ignition sequence illustrated in FIGS. 4 and 5, in the triangular ignition sequence of FIG. 6, even during each pulse train, the voltage level increases for successive pulses. In the particular exemplary embodiment illustrated in FIG. 6, after six successive pulse trains, the voltage assumes a constant level for subsequent pulse trains. As illustrated in FIG. 6, the peak voltage during a pulse train need not be constant. For example, during a pulse train, the peak voltage can vary in a step-wise fashion over time within the pulse train.

Figure 7:
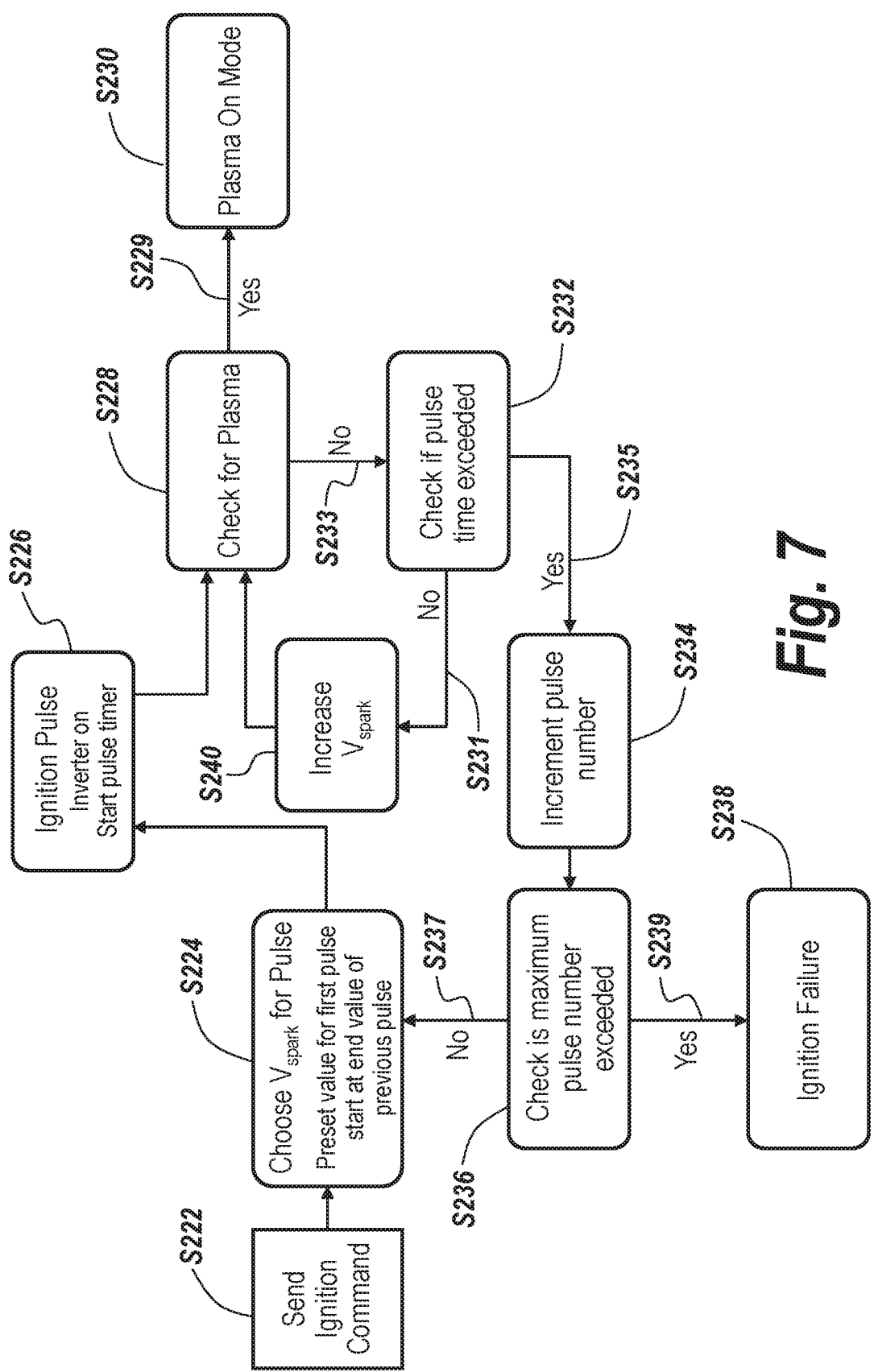
FIG. 7 includes a logical flow diagram illustrating the logical flow of the triangular or sloped ignition sequence of FIG. 6, according to some exemplary embodiments.

FIG. 7 includes a logical flow diagram illustrating the logical flow of the triangular or sloped ignition sequence of FIG. 6, according to some exemplary embodiments. Referring to FIG. 7, a plasma ignition command is generated and transmitted in step S222. Next, a voltage level VSpark is chosen for the first pulse in step S224. The voltages for the first ignition pulse can be a preset value, based on various parameters related to the particular plasma generation application. Subsequent pulses can have a starting voltage level equal to the end voltage level of the previous pulse. Next, the ignition pulse is generated in step S226. During this step, inverter circuit 122 is enabled and a pulse timer is started. Next, a check is performed to determine whether plasma has ignited and is being generated in step S228. If so, flow continues to the plasma-on mode in step S230, via Yes branch S229. If not, a check is performed to determine whether the prescribed pulse duration time has been reached in step S232, via No branch S233. If the pulse duration has not been reached, then flow moves along No branch S231 to step S240, where the voltage level of the pulse is increased. Again, a check is made for plasma in step S228. This loop checking for plasma and increasing the pulse voltage until the pulse time duration expires continues via No branches S231 and S233 until the prescribed pulse duration is reached, and the pulse number is incremented in step S234, via Yes branch S235. Next, a check is performed to determine whether the maximum number of pulses has been reached, i.e., whether the last pulse of the VSpark sequence has completed, in step S236. If not, then flow returns along No branch S237 to step S224, at which a voltage for the next pulse in the VSpark waveform is selected. On the other hand, if it is determined in step S236 that the last pulse has been reached, then flow moves to step S238 along Yes branch S239, wherein it is concluded that an ignition failure has occurred.

Figure 8:
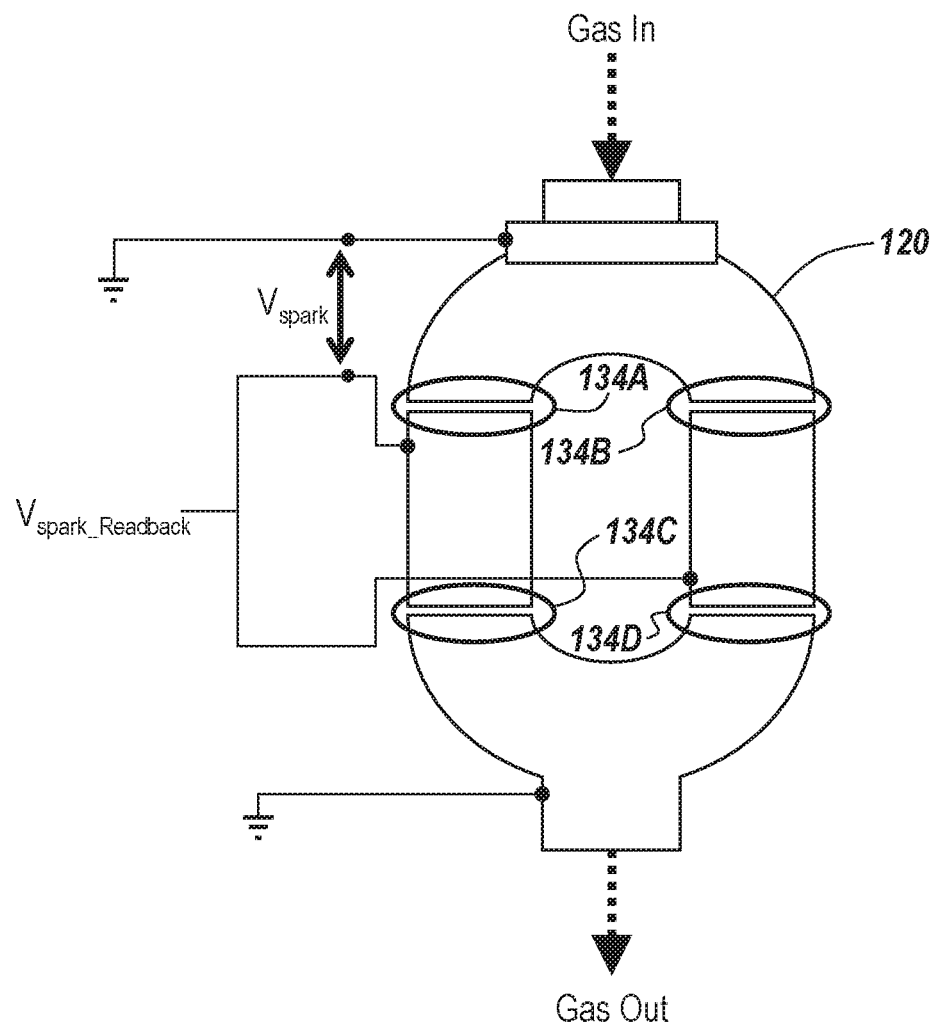
FIG. 8 includes a schematic diagram of a toroidal plasma tube, plasma block, or plasma confining region, as described above in detail, with connections for applying ignition voltage VSpark and monitoring voltage in the plasma block, according to some exemplary embodiments.

FIG. 8 includes a schematic diagram of a toroidal plasma tube, plasma block, or plasma confining region 120, as described above in detail, with connections for applying ignition voltage VSpark and monitoring voltage in plasma block 120, according to some exemplary embodiments. Referring to FIG. 8, the monitored voltage in plasma block 120 is identified herein by the variable VSpark_Readback. The voltage VSpark_Readback is sensed across plasma block 120 as shown, or in any of many other possible locations on plasma block 120. Ignition voltage VSpark, referenced to ground, is shown applied across plasma block 120. Ground reference is shown at the body of plasma block 120.

Figure 9:
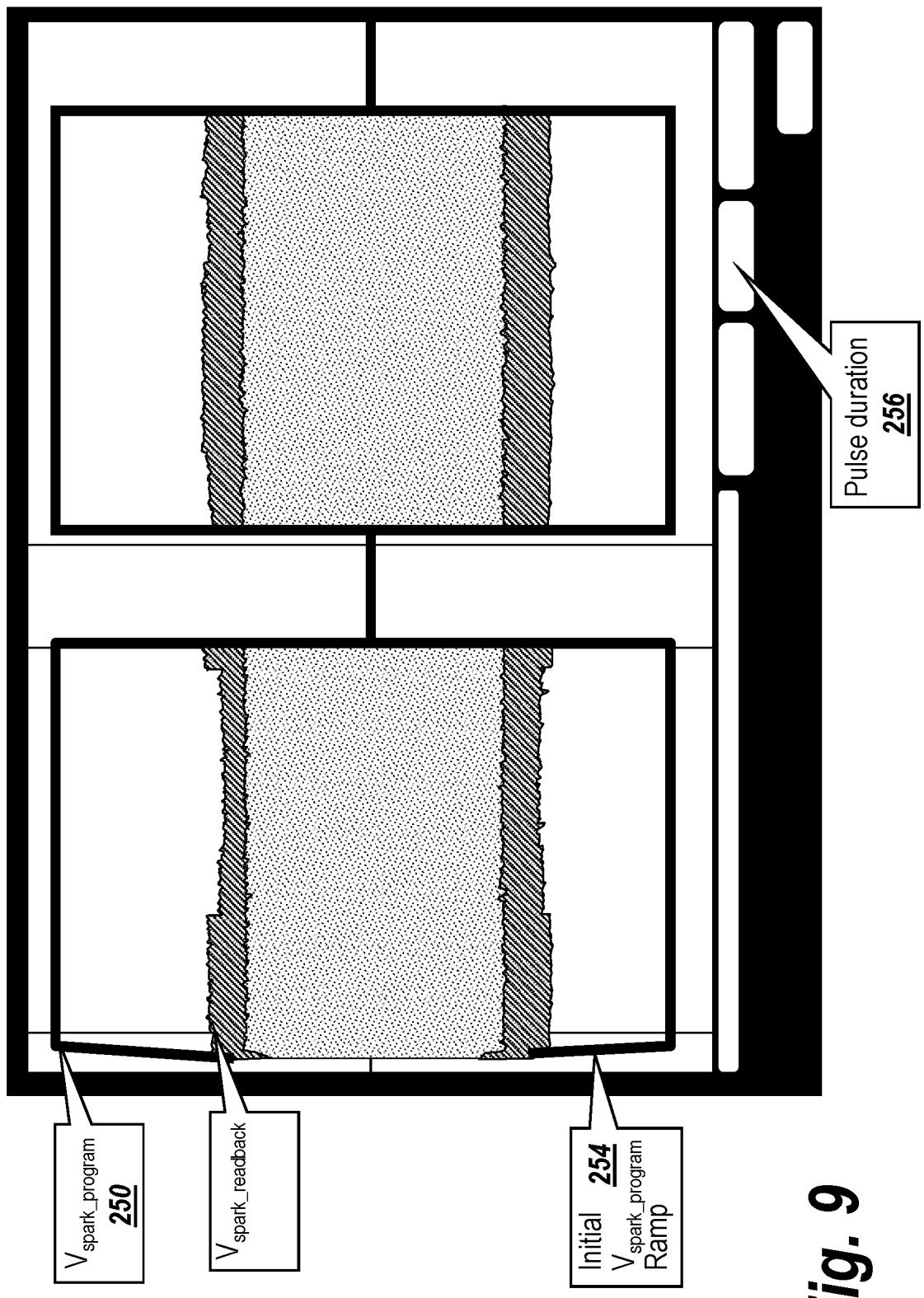
FIG. 9 is a waveform diagram over time of the programmed VSpark ignition waveform, VSpark_Program, according to some exemplary embodiments.

FIG. 9 is a waveform diagram over time of the programmed VSpark ignition pulse train envelope waveform, VSpark_Program, identified as 250, according to some exemplary embodiments. The VSpark_Program pulse train envelope waveform 250 is analogous to the pulse train envelope waveforms illustrated in FIGS. 4 and 6. As shown in FIG. 9, each pulse train of VSpark_Program 250 includes an initial VSpark_Program voltage ramp 254 of relatively short time duration. The time duration of each pulse train is indicated by a pulse train duration arrow 256 along the time axis.

Figure 10:
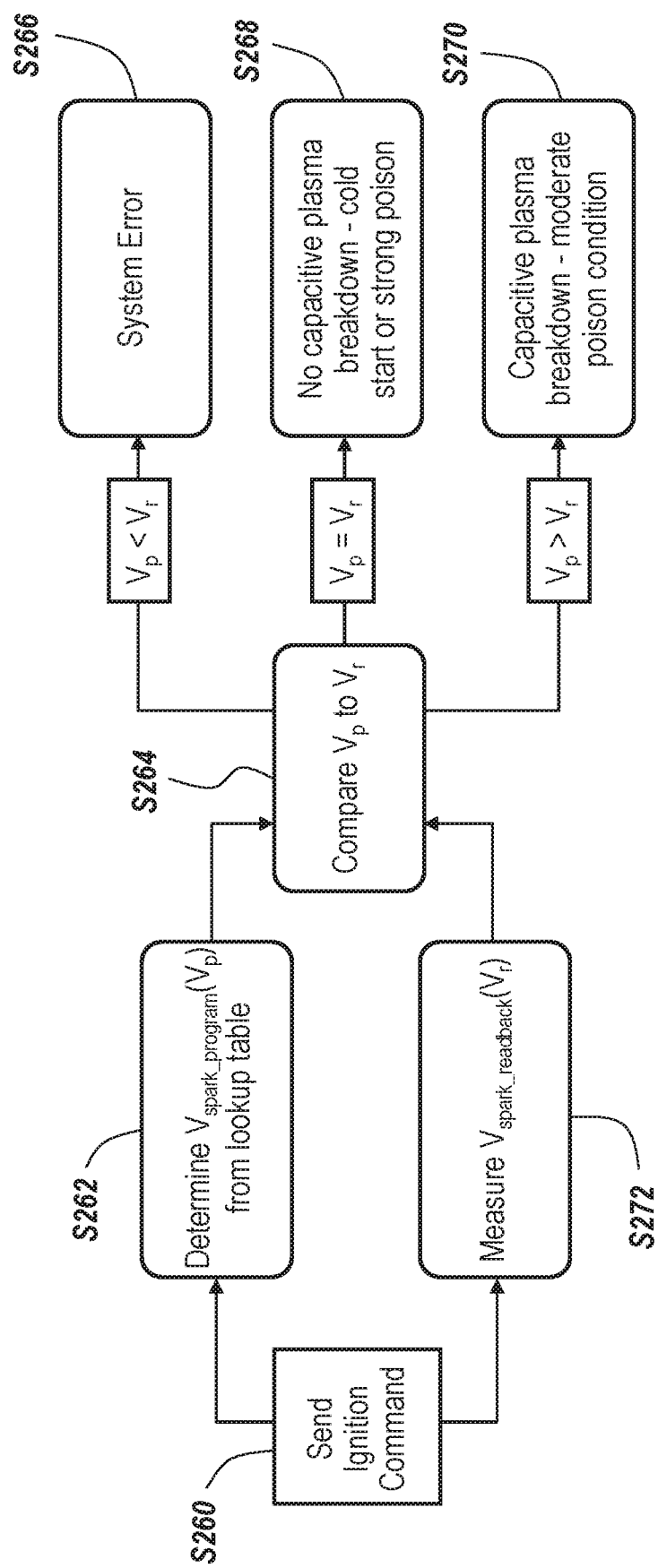
FIG. 10 includes a logical flow diagram illustrating the logical flow of voltage monitoring during plasma ignition illustrated in the timing curve of FIG. 9, according to some exemplary embodiments.

FIG. 10 includes a logical flow diagram illustrating the logical flow of voltage monitoring during plasma ignition illustrated in the timing curve of FIG. 9, according to some exemplary embodiments. Referring to FIGS. 8-10, an ignition command is sent in step S260. Next, VSpark_Program is determined, such as from a look-up table, and the ignition voltage VSpark, based on VSpark_Program, is applied to plasma block 120 to initiate the ignition procedure, in step S262. Also, VSpark_Readback is sensed in step S272. Next, VSpark_Program $V_P$ is compared to VSpark_Readback $V_R$ in step S264. If $V_P < V_R$, then a system error is declared in step S266. If $V_P = V_R$, then it is concluded in step S268 that no capacitive plasma breakdown has occurred, which can be due to a "cold start" in which insufficient free electrons are present in the plasma block 120 for ignition, or a high level of contamination is present in plasma block 120, i.e., a "poison" condition exists. If $V_P > V_R$, then it is concluded in step S270 that capacitive plasma breakdown has occurred to some degree and that a moderate poison condition exists in plasma block 120.

Figure 11:
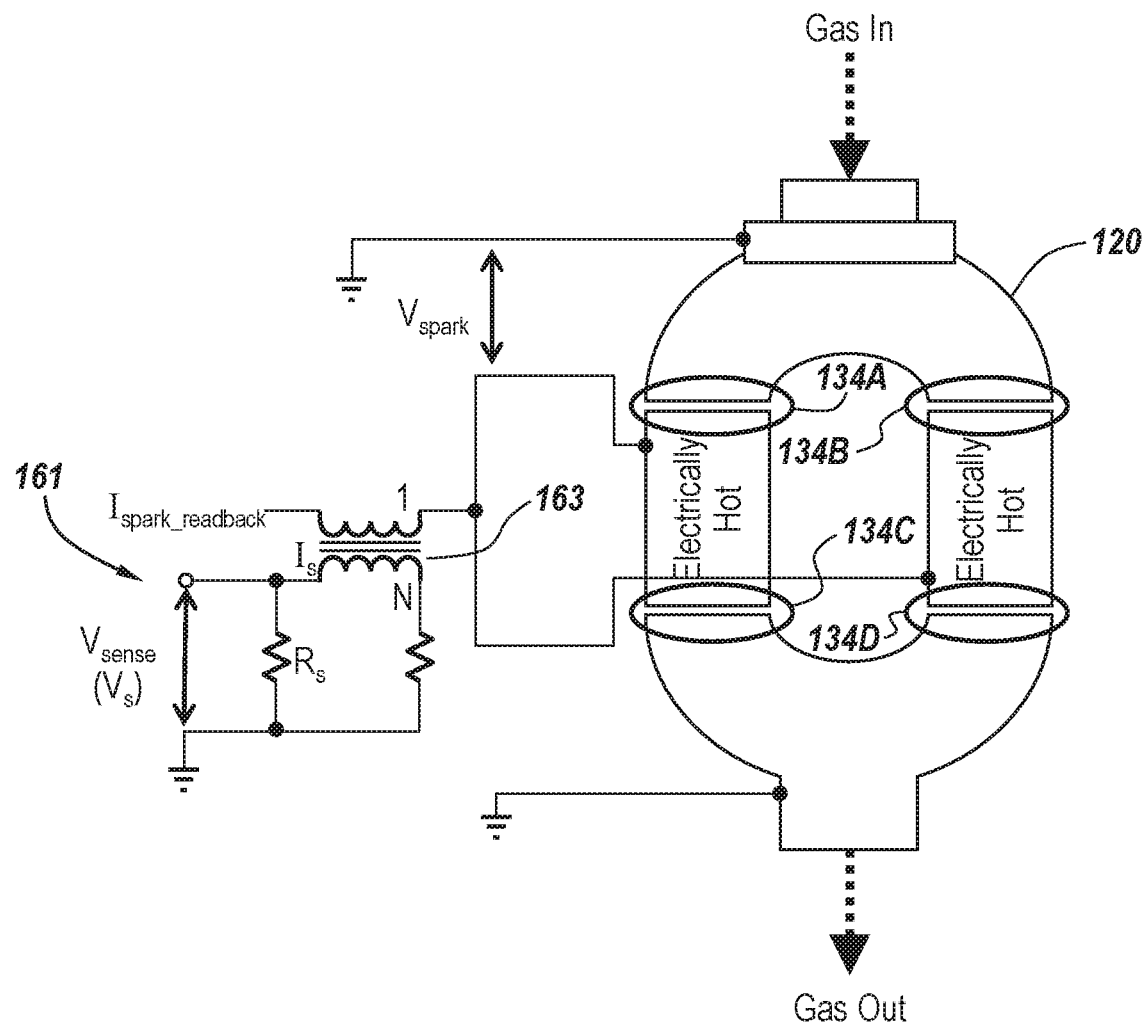
FIG. 11 includes a schematic diagram of toroidal plasma tube, plasma block, or plasma confining region, with connections for applying ignition voltage VSpark and, therefore, ignition current ISpark, and for monitoring current in a plasma block, according to some exemplary embodiments.

FIG. 11 includes a schematic diagram of toroidal plasma tube, plasma block, or plasma confining region 120, as described above in detail, with connections for applying ignition voltage VSpark and, therefore, ignition current ISpark, according to some exemplary embodiments. Ignition voltage VSpark, referenced to ground, is shown applied across plasma block 120. Ground reference is shown at the body of plasma block 120. Referring to FIG. 11, the current ISpark_Readback is sensed by a sensor or sensing circuit 161, which includes a transformer 163 having a turns ratio of N:1. A sense voltage $V_S$ can be sensed across sense resistance $R_S$, the sense current Is passing through $R_S$ resulting in sense voltage $V_S$.

$I_S = I\text{SparkReadback} \div N$; and $V_S = I_S \times R_S$; therefore, $I\text{Spark\_Readback} = N \times I_S = N \times V_S / R_S$.

Figure 12:
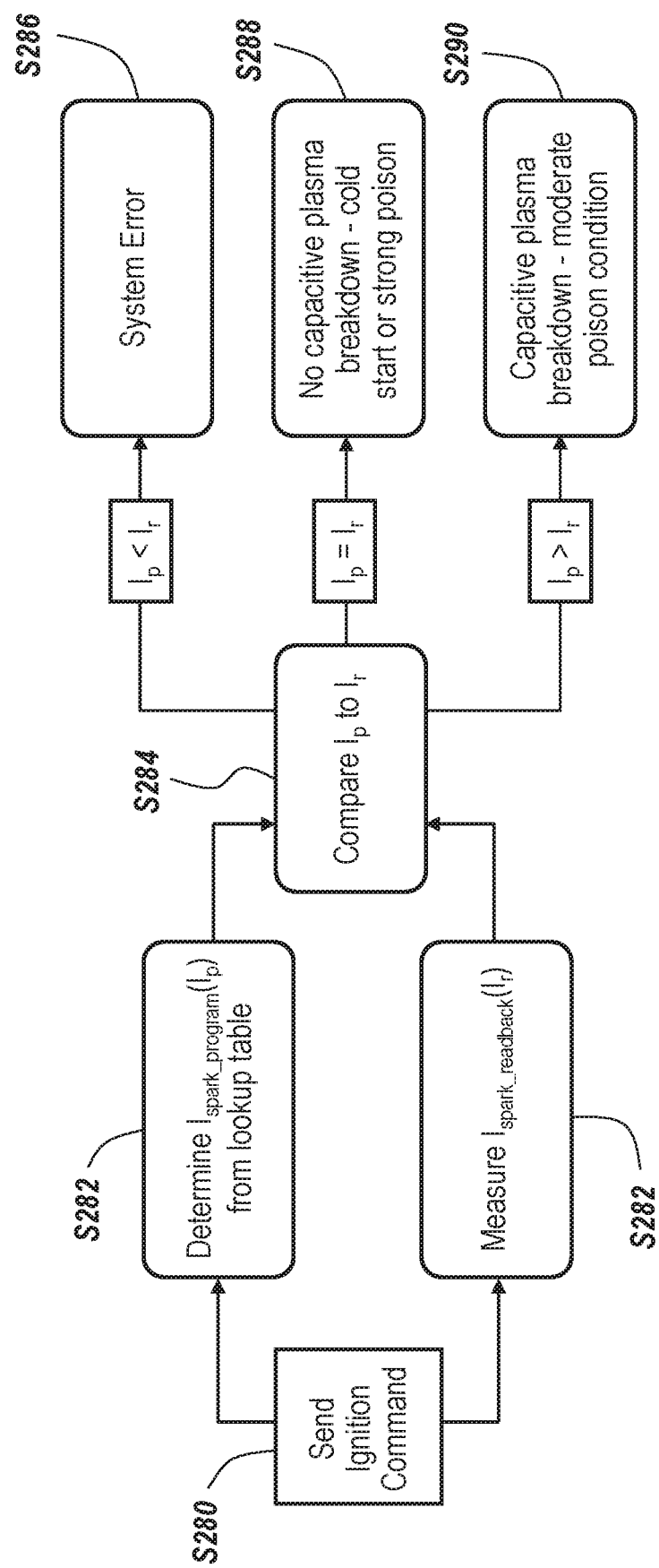
FIG. 12 includes a logical flow diagram illustrating the logical flow of current monitoring during plasma ignition illustrated in the timing curve of FIG. 9, according to some exemplary embodiments.

FIG. 12 includes a logical flow diagram illustrating the logical flow of current monitoring during plasma ignition illustrated in the timing curve of FIG. 9, according to some exemplary embodiments. Referring to FIGS. 9, 11 and 12, an ignition command is sent in step S280. Next, the intended ignition current ISpark_Program is determined, such as from a look-up table, and the ignition voltage VSpark, based on ISpark_Program, is applied to plasma block 120 to initiate the ignition procedure, in step S282. Also, ISpark_Readback is sensed in step S292. Next, ISpark_Program $I_P$ is compared to ISpark_Readback $I_R$ in step S284. If $I_P > I_R$, then a system error is declared in step S286. If $V_P = V_R$, then it is concluded in step S288 that no capacitive plasma breakdown has occurred, which can be due to a "cold start" in which insufficient free electrons are present in the plasma block 120 for ignition, or a high level of contamination is present in plasma block 120, i.e., a "poison" condition exists. If $I_P < I_R$, then it is concluded in step S290 that capacitive plasma breakdown has occurred to some degree and that a moderate poison condition exists in plasma block 120.

Figure 13A:
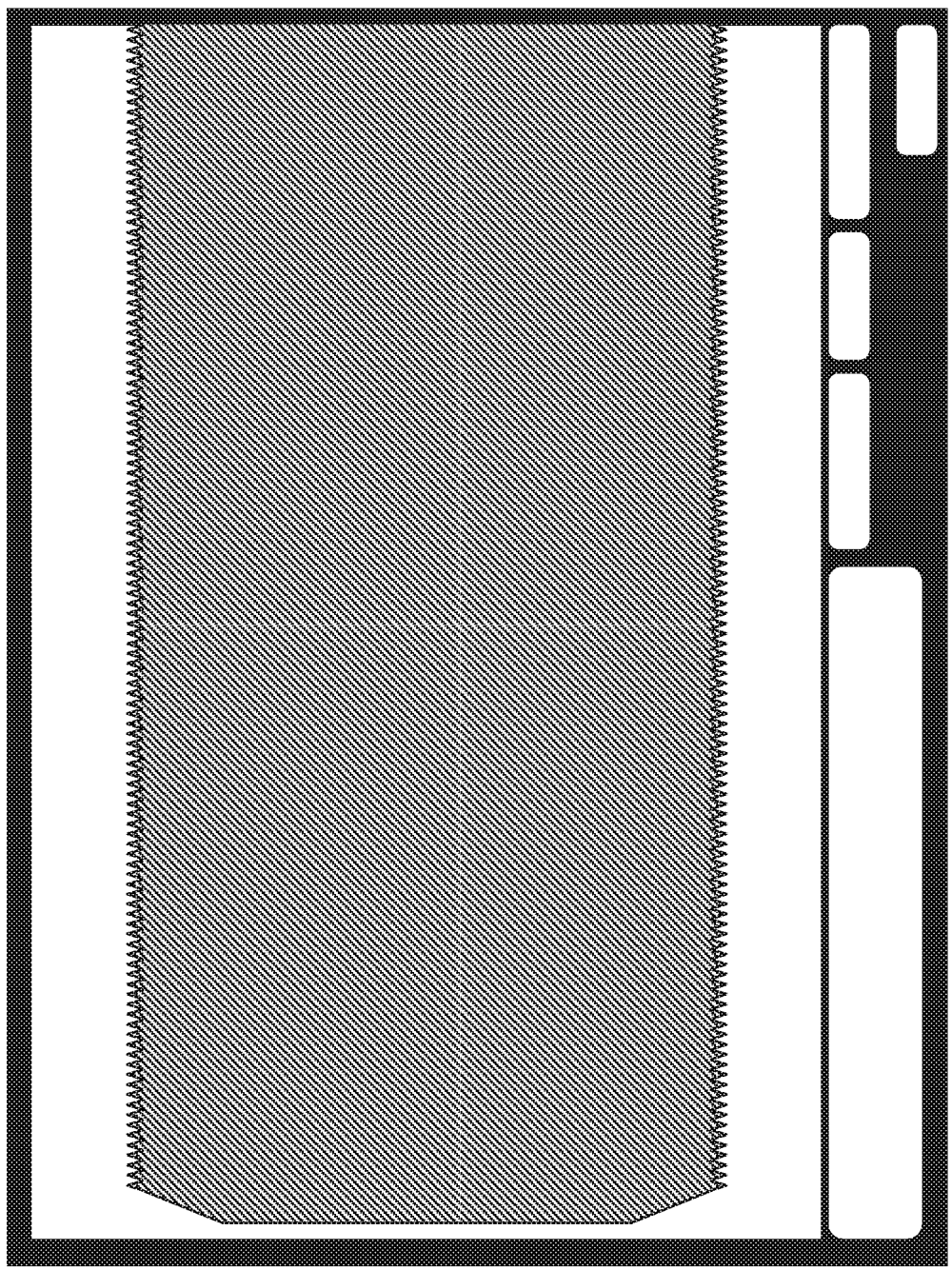
FIGS. 13A through 13C include waveform diagrams over time of the programmed VSpark ignition waveform and resulting sensed VSpark_Readback signal, under different ignition conditions, according to some exemplary embodiments.
Figure 13B:
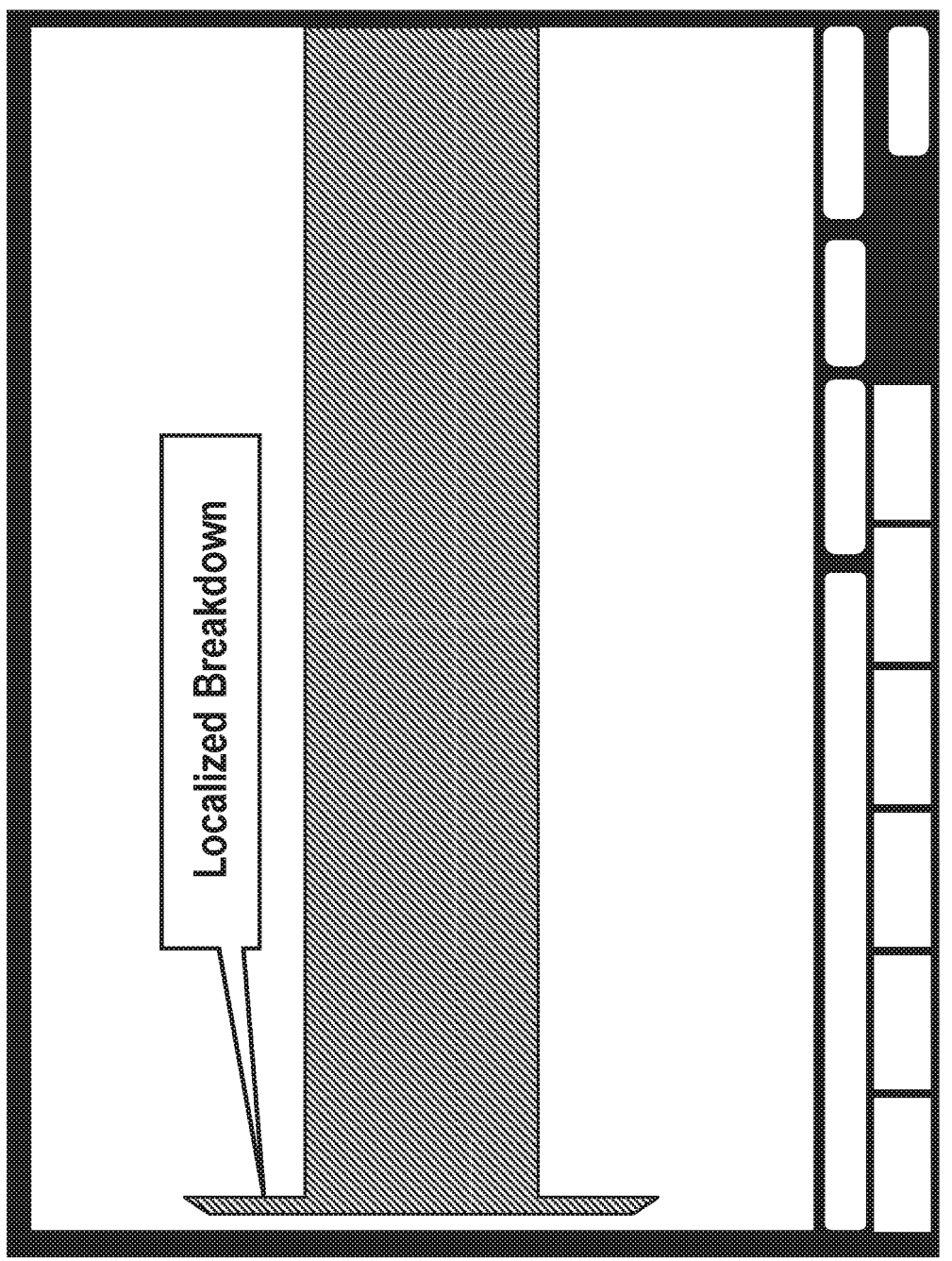
Figure 13C:
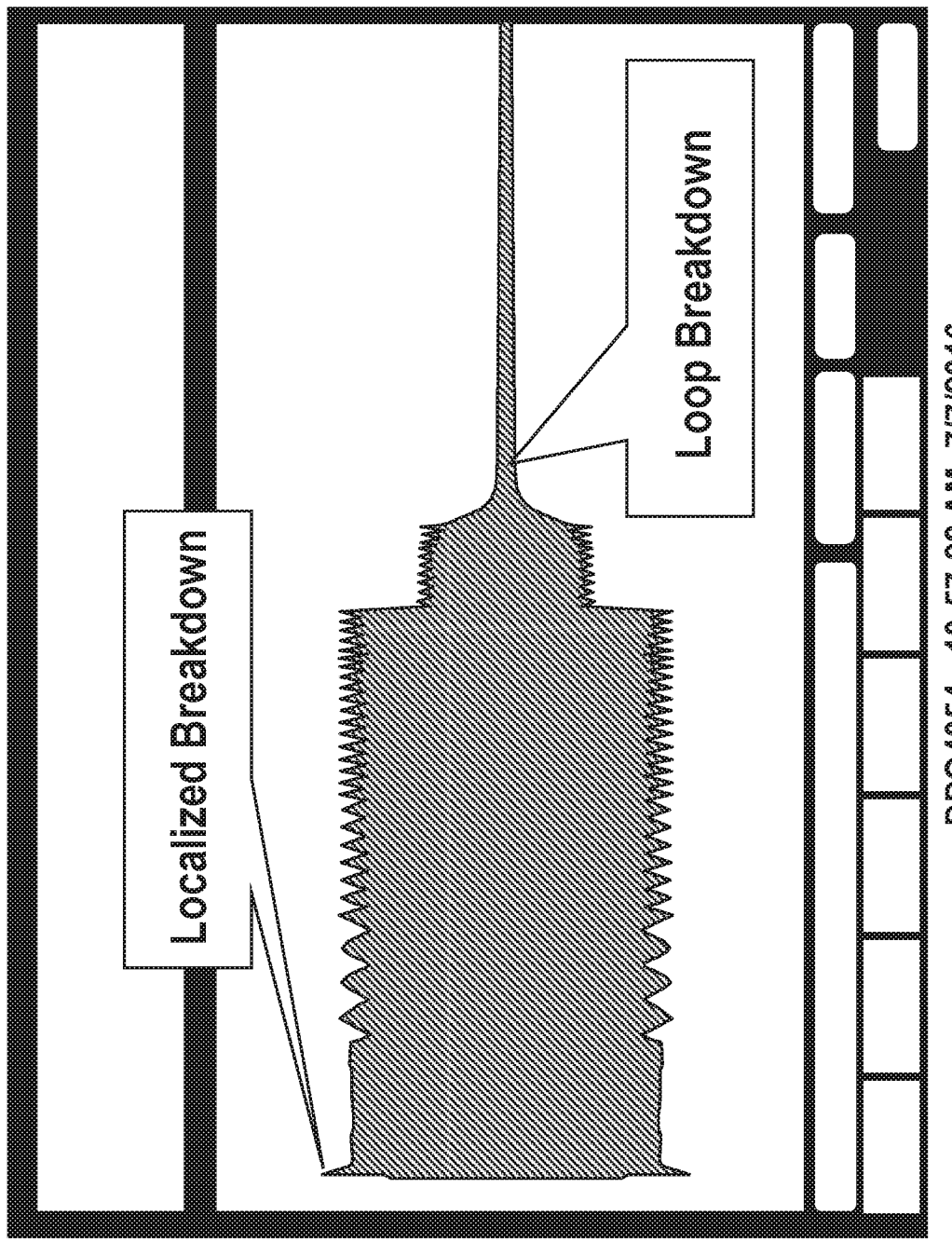

FIGS. 13A through 13C include waveform diagrams over time of the programmed VSpark ignition waveform and resulting sensed VSpark_Readback signal, under different ignition conditions, according to some exemplary embodiments. In the three illustrated scenarios of FIGS. 13A through 13C, contamination level, in these specific example, using $N_2$ gas as a contaminant, is varied to produce different ignition results. That is, the poison level is varied to illustrate different types of ignition and ignition failure. All of the scenarios of FIGS. 13A through 13C are implemented at a pressure of 2 Torr at an Argon flow rate of 2.0 standard liters per minute (slm). In FIG. 13A, $N_2$ gas is introduced as a contaminant at a flow rate of 500 standard cubic centimeters per minute (sccm). In FIG. 13B, $N_2$ gas is introduced as a contaminant at a flow rate of 200 sccm. In FIG. 13C, no contamination is introduced.

Referring to FIG. 13A, with the highest of the three contamination levels, no breakdown occurs, such that ignition fails. In the poor ignition conditions of FIG. 13A, high voltage is applied for a large amount of time, and there is no creation of plasma, or localized breakdown. Thus, the voltage applied on the midblocks and on the plasma loop stays at the high value determined by the resonant circuit of the ignition circuit.

Referring to FIG. 13B, with a somewhat lower level of contamination, only localized breakdown occurs. That is, full loop breakdown does not occur. In this case, the poison (contaminant) level is preventing electrons from accelerating around the entire plasma loop, meaning that ignition of the plasma loop fails. In the case of FIG. 13C, in the absence of contamination, after high voltage is applied to the plasma block, a localized breakdown in the high field regions near the biased blocks is created. The localized breakdown acts as a resistive path to ground, thus decreasing the ignition voltage as the charge on the capacitor bleeds down thru the resistor (as illustrated in FIG. 12). Once the plasma loop is completed, it shunts the secondary loop on the transformer, due to the very low resistive impedance in a plasma, thus effectively dropping the voltage that can be held on the primary coils. Hence, VSpark and VLoop decrease substantially, and localized breakdown occurs. The localized breakdown cascades around the entire plasma loop, resulting in complete loop breakdown and complete, successful plasma ignition.

Figure 14A:
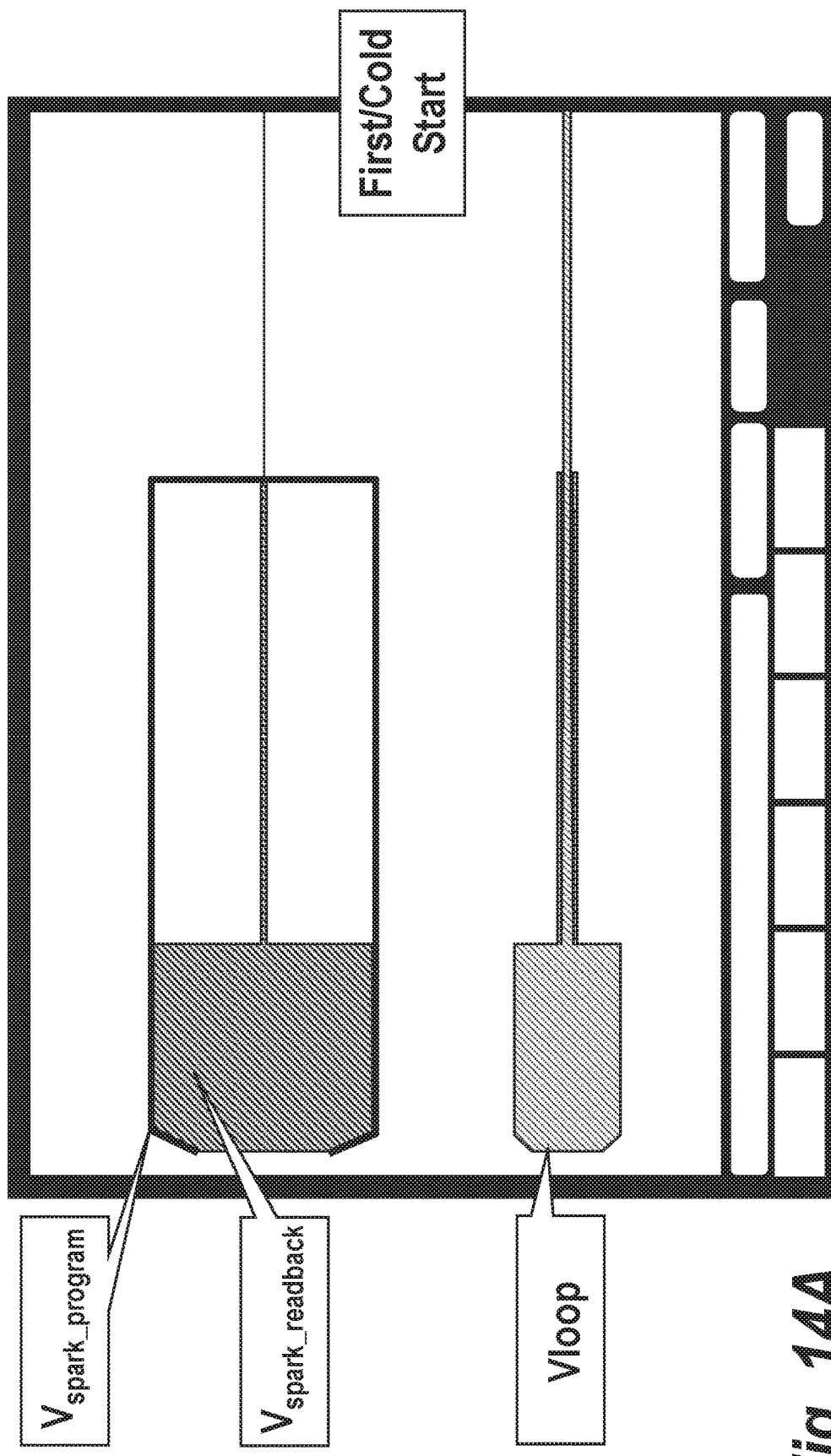
FIGS. 14A and 14B includes two waveform diagrams over time of the programmed VSpark ignition waveform VSpark_Program, the resulting sensed VSpark_Readback signal, and the VLoop signal, under a cold start ignition scenario and a normal ignition scenario, respectively, according to some exemplary embodiments.
Figure 14B:
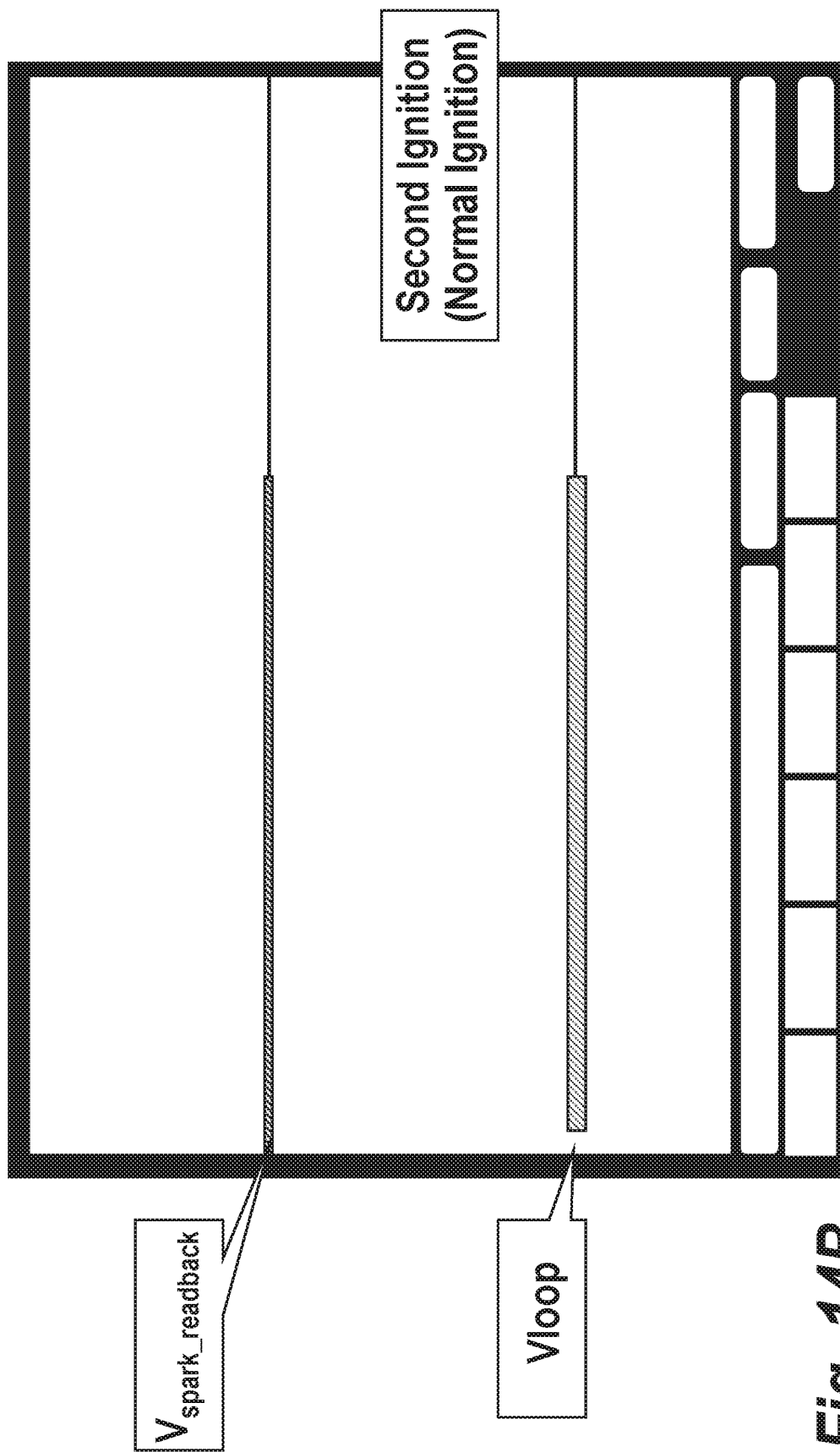

FIGS. 14A and 14B includes two waveform diagrams over time of the programmed VSpark ignition waveform VSpark_Program, the resulting sensed VSpark_Readback signal, and the VLoop signal, under a cold start ignition scenario and a normal ignition scenario, respectively, according to some exemplary embodiments. Referring to FIG. 14A, in the first ignition attempt, longer total ignition time, i.e., longer time to VLoop breakdown, is caused by longer time to initial breakdown due to cold start conditions, i.e., a shortage of free electrons in the plasma block. In the first ignition attempt, the time to ignition, i.e., total VLoop breakdown, was approximately 100 ms. That is, the time to initial breakdown, when VSpark_Readback= VSpark_Program, was approximately 100 ms, followed by immediate loop breakdown thereafter, i.e., VSpark_Readback<<VSpark_Program. In the second (normal) ignition, illustrated in FIG. 14B, both initial and loop breakdowns occurred almost immediately.

Figure 15A:
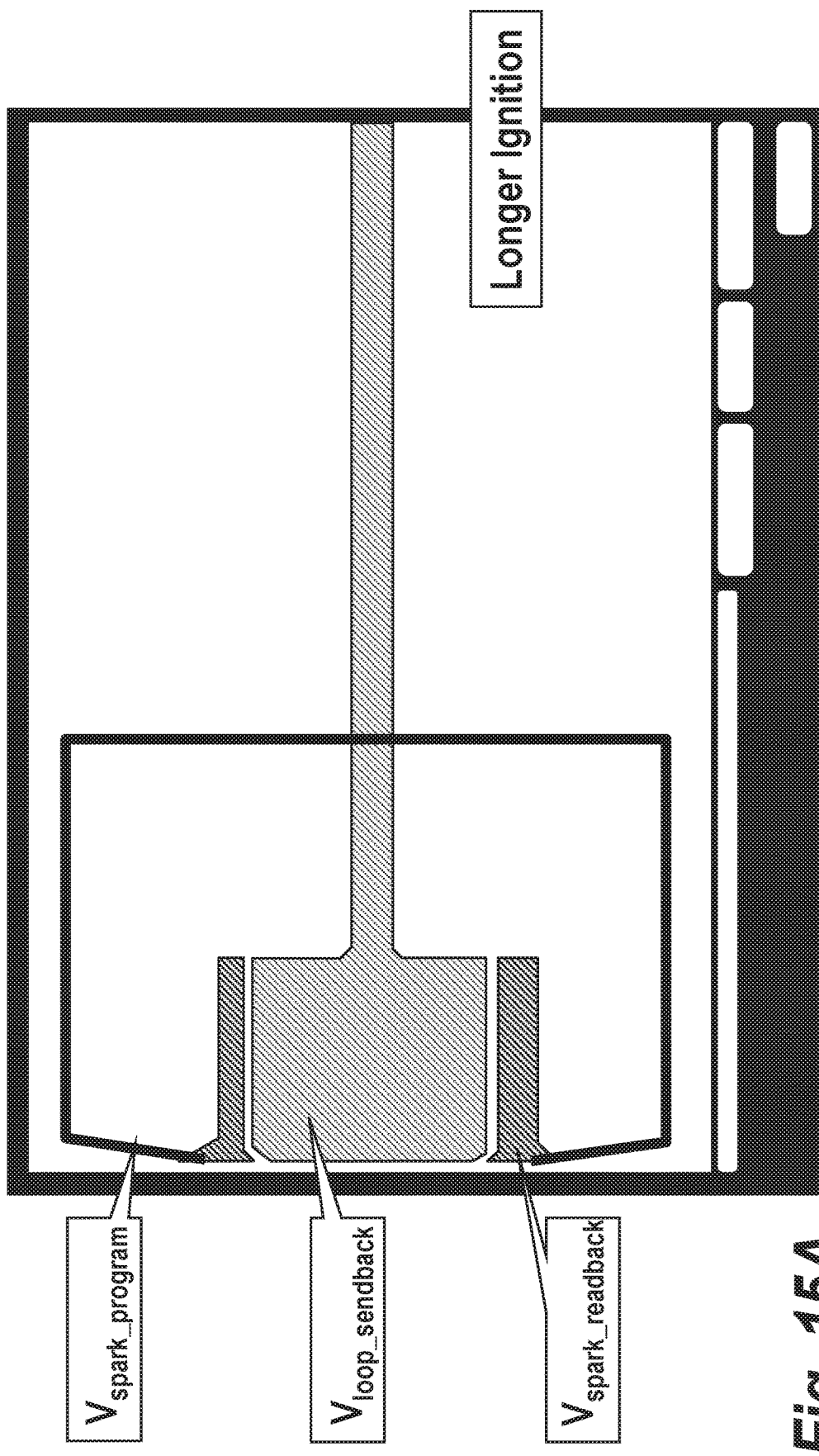
FIGS. 15A and 15B include two waveform diagrams over time of the programmed VSpark ignition waveform VSpark_Program, the resulting sensed VSpark_Readback signal, and the VLoop signal, under poison (contamination) ignition conditions, in the case of a long-duration ignition scenario and a failed ignition scenario, respectively, according to some exemplary embodiments.
Figure 15B:
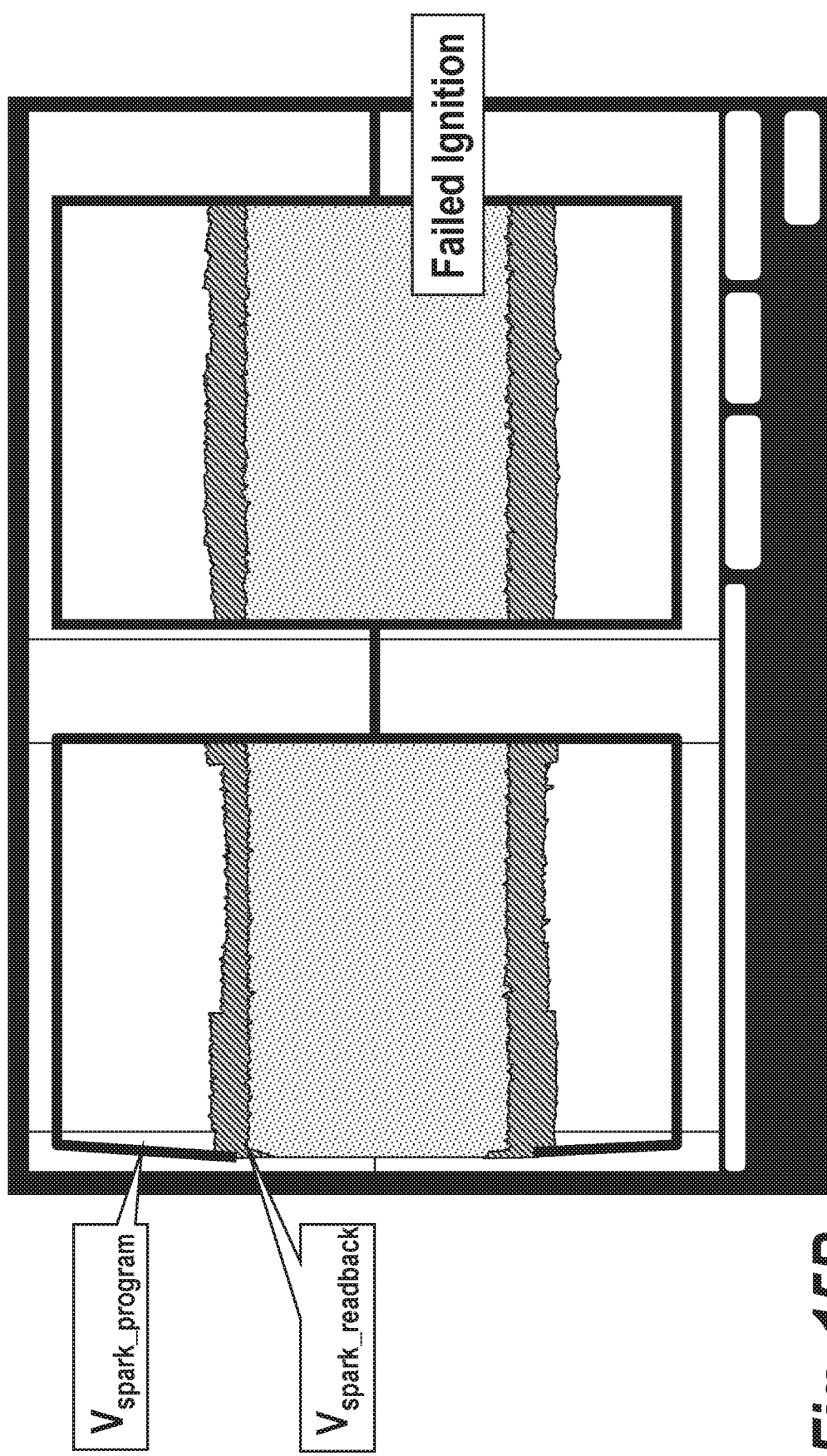

FIGS. 15A and 15B include two waveform diagrams over time of the programmed VSpark ignition waveform VSpark_Program, the resulting sensed VSpark_Readback signal, and the VLoop_Readback signal, under poison (contamination) ignition conditions, in the case of a long-duration ignition scenario and a failed ignition scenario, respectively, according to some exemplary embodiments. Referring to FIGS. 15A and 15B, during 5000 ignition attempts under poisoned ignition conditions, VSpark_Readback and VLoop were recorded. After localized breakdown, VSpark_Readback drops in amplitude, and VLoop still continues to ramp to full voltage (since the plasma loop is not completely closed, the secondary loop representing plasma in a transformer is open and can sustain the higher loop Voltage). This Vloop collapses (reduces to a lower amplitude) as the plasma loop is formed and becomes proportional to the Plasma Current X Plasma Impedance. Fluctuations in VSpark_Readback, as indicated by the dip in the signal seen in FIG. 15B, can be concluded to indicate arcing or an unstable plasma loop in the plasma block, contributing to the failed ignition. It is noted that, after 1,000 ignitions, the inlet plasma block was severely damaged by the plasma. It is believed that the total time duration when there is initial breakdown but incomplete plasma loop formation, as shown in FIGS. 15A and 15B, is related with plasma block life, since the ions formed in the vicinity of the biased plasma blocks can be accelerated back into the plasma block surfaces and cause damage to the protective dielectric coatings thus lowering the useful life of the blocks, and, in accordance with the present disclosure, can be used as a trigger for block replacement and/or process interlock.

According to exemplary embodiments, by starting at a lower ignition voltage, the system is able to ignite under favorable gas conditions at a lower voltage, which results in reduced electric fields within the plasma block (E=V/thickness), thus reducing the possibility of a catastrophic breakdown of the dielectric in the high field region, which could result in ablation of the coating causing particles.

The approach of the present disclosure provides the most benign ignition possible. Also, according to the disclosure, process and RPS health monitoring through changes in ignition voltage can be carried out over longer-term operation. Block coating integrity, i.e., dielectric strength, and changes therein may be determined from this voltage.

According to the disclosure, the breakdown voltage can also serve as a quality control metric for the block and different feed gases.

When high voltage is applied to the blocks for igniting the plasma, there can be a parasitic arcing event if the coating is compromised in any location and cannot hold the electrostatic field. This can occur when the local dielectric breakdown strength is weaker than the applied electric field and can result in an arc to other grounded regions in the vicinity of the biased electrode. This may cause coating to erode in this area due to arcing damage induced during the electrical breakdown. Such erosion and damage to the block coatings can be minimized by the smart ignition scheme provided herein, where the voltage can be ramped to enable plasma strike at the lowest possible potential and via smart learning where the previously learned potential for a given process condition can be applied to strike plasma for processing the next substrate.

The present disclosure also provides for diagnostic monitoring for plasma ignition conditions. According to exemplary embodiments, the voltage needed for ignition also provides a means for health check of the system and can be used to monitor drifts in the process conditions over longer periods of time. This can also be a means to protect substrates from being processed incorrectly due to inadvertently drifting plasma or block conditions, and can further serve as a means to monitor plasma block health in case there is erosion of the block due to the exposure of the block/coating surfaces to highly reactive plasma environments, especially with halogen, O or H containing gases, or due to deposition of other species on the block surfaces, either due to back streaming of condensable precursors from the process chambers or due to the gases being used in the remote plasma sources, e.g., C or S or Al, etc. containing precursors. Alternatively, this can involve chemical modification of the plasma facing surfaces of the remote plasma source. This can cause changes in the time or voltage needed for ignition. Such changes can provide useful diagnostics for a system using these remote plasma sources for integrating a trigger for other process or maintenance activities to reset the plasma conditions to within the control limits. These diagnostics can be used for "On-wafer" processing applications where a minor change in radical output could cause significant yield loss to the end user. Having a diagnostic that can effectively be used to monitor radical recombination in a plasma source is useful in such applications that merit a high degree of process control.

The present disclosure also provides a "smart," i.e., self-learning, ignition scheme for plasma sources. The self-learning ignition scheme for plasma source according to the disclosure can be used for minimizing the plasma ignition time when processing multiple substrates with the same processes. The approach involves recording the Plasma strike conditions for different stages in a process recipe sequence from the first few substrates (learning substrates) and then using the "learned" values for processing the remaining substrates. This assures process repeatability and minimizes/prevents scrap events that can be very costly to the end users. Typical semiconductor device substrates are worth tens of thousands of dollars, which is typically worth more than the cost of a remote plasma unit itself. The smart (self-learning) approach of the present disclosure also minimizes erosion of the blocks by minimizing the time the block coating is exposed to high fields as well as minimizes the magnitude of the field that is required to ignite the plasma, thus enabling a superior defect performance, e.g., minimizing the generation of defects, that is important for any on-wafer processes where the device yields are directly correlated to defects in the films generated during process.

Thus, according to the plasma ignition approach of the present disclosure, a VSpark_Ratio signal is generated from the ratio of VSpark_Readback/VSpark_Program in the plasma block to determine and report back if plasma ignition is occurring in cold start or poison conditions, or if ignition was normal. This guides any remediation techniques applied to the situation.

Also, according to the disclosure, a timer is used with VSpark_Ratio=VSpark_Readback/VSpark_Program to give an approximation of block health. In general, the longer the time with localized breakdown and no loop breakdown, the more damage results to plasma blocks.

Also, according to the disclosure, plasma chamber conditions can be determined during ignition using the time duration to ignition and/or the value of VSpark_Program needed for successful ignition.

Also, according to the disclosure, arc detection can be generated using the noise on the VSpark_Ratio=VSpark_Readback/VSpark_Program signal. As illustrated in FIG. 16B, the VSpark_Readback signal exhibits erratic behavior during an unsuccessful ignition. Specifically, the value of VSpark_Readback drops from the value of VSpark_Program, but shows low-frequency noise, which is indicative of arcing or unstable plasma formation conditions. Thus, detection of this noise can be used to diagnose occurrence of an arcing or unstable plasma formation condition.

Also, according to the disclosure, it should be noted that all of the elements of the disclosure are equally applicable using a measured current signal that provides VSpark bias to the plasma blocks.

Figure 16:
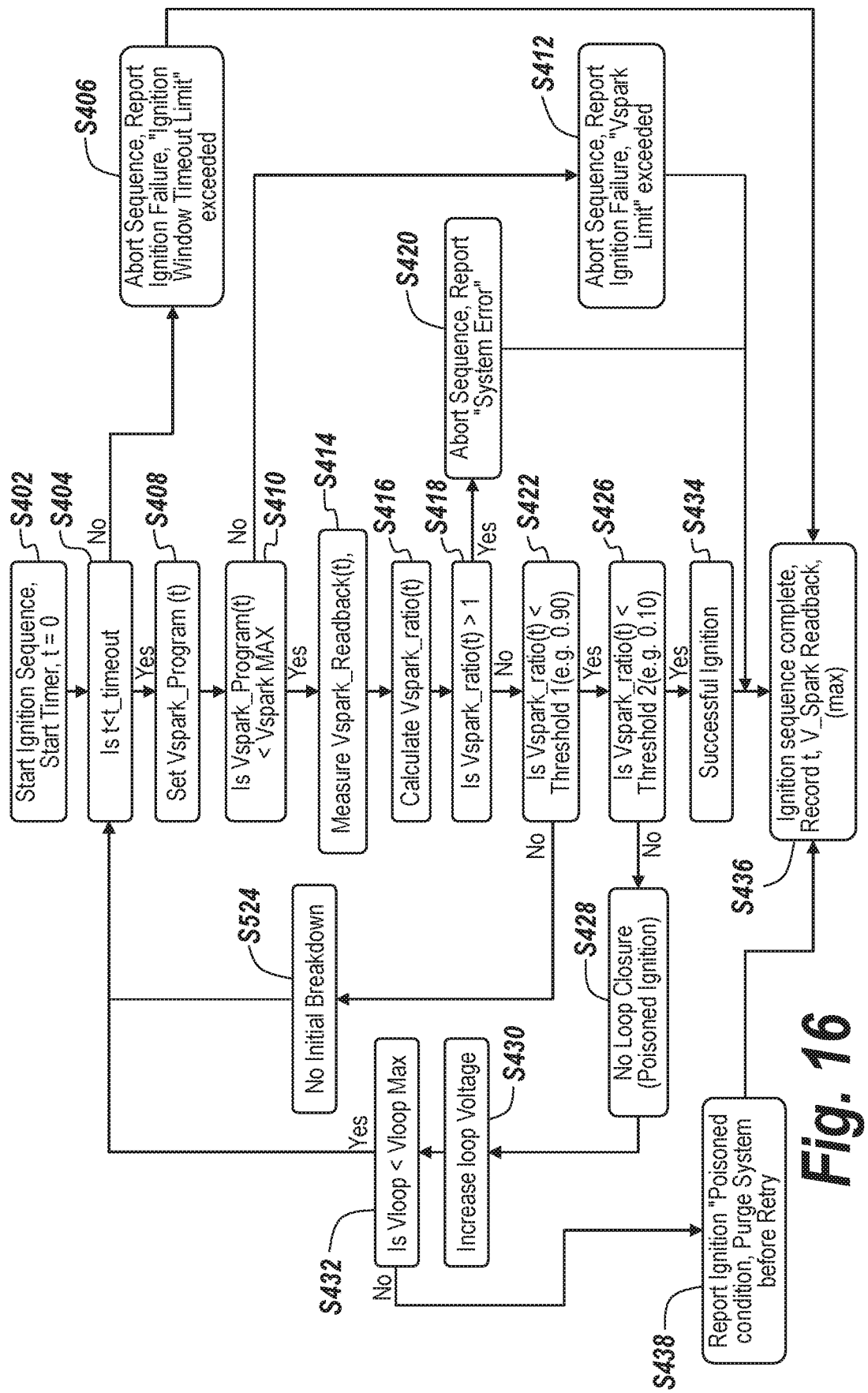
FIG. 16 includes a schematic logical flow diagram of a plasma ignition procedure, according to some exemplary embodiments.

FIG. 16 includes a schematic logical flow diagram of a plasma ignition procedure, according to some exemplary embodiments. Referring to FIG. 16, the ignition sequence starts by starting a timer at t=0, in step S402. Next, the time t is checked to determine if timeout has been reached, in step S404. In some exemplary embodiments, timeout can be set at 5-15 seconds. If timeout is reached, flow moves along No branch out of step S404 to step S406, where the sequence is aborted, and ignition failure is reported due to ignition window timeout limit exceeded. Flow then moves to step S436 where the ignition sequence is declared complete, the time to ignition t is recorded and the maximum VSpark_Readback reached during ignition is recorded. If timeout is not reached, then flow moves along the Yes branch out of step S404 to step S408, where the value of VSpark_Program is set, such as by obtaining the value from a look-up table. Next, in step S410, it is determined whether the value of VSpark_Program is less than a preset maximum VSpark value. If not, then flow moves along the No branch out of step S410 to step S412, where the sequence is aborted, and ignition failure is reported due to VSpark limit exceeded. Flow then moves to step S436 where the ignition sequence is declared complete, the time to ignition t is recorded and the maximum VSpark_Readback reached during ignition is recorded. If the maximum VSpark value is not exceeded, then flow moves along the Yes branch out of step S410 to step S414, where the VSpark_Readback signal is measured. The VSpark_Ratio signal=VSpark_Readback/VSpark_Program is computed in step S416. In step S418, if the VSpark-Ratio signal is greater than 1, meaning the VSpark_Readback signal is greater than the VSpark_Program signal, then flow moves along the Yes branch out of step S418 to step S420, where the sequence is aborted, and a system error is reported. Flow then moves to step S436 where the ignition sequence is declared complete, the time to ignition t is recorded and the maximum VSpark_Readback reached during ignition is recorded. If the ratio is not greater than 1, then flow moves along the No branch out of step S418 to step S422, where it is determined whether the ratio is less than some first threshold value, referred to herein as Threshold 1, which, in some particular exemplary embodiments, is 0.90. If not, then flow moves along the No branch out of step S422 to step S424, where it is concluded that no initial breakdown has yet occurred, and flow returns to step S404. If the ratio is less than Threshold 1, then flow moves along the Yes branch out of step S422 to step S426, where it is determined whether the ratio is less than some second threshold value, referred to herein as Threshold 2, which, in some particular exemplary embodiments, is 0.10. If not, then flow moves along the No branch out of step S426 to step S428, where it is concluded that loop closure has not yet occurred, and, therefore, that a poisoned ignition condition exists. Flow then moves to step S430, where the loop voltage is increased, and then to step S432, where it is determined whether the new loop voltage is below the maximum allowable VLoop value. If not, then flow moves along the No branch out of step S432 to step S438, where an ignition poisoned condition is reported, and a notice is issued requiring purging of the system before a retry of ignition. Flow then moves to step S436 where the ignition sequence is declared complete, the time to ignition t is recorded and the maximum VSpark_Readback reached during ignition is recorded. If the new loop voltage is below the maximum allowable VLoop value, then flow moves along the Yes branch out of step S432 back to step S404.

Figure 17:
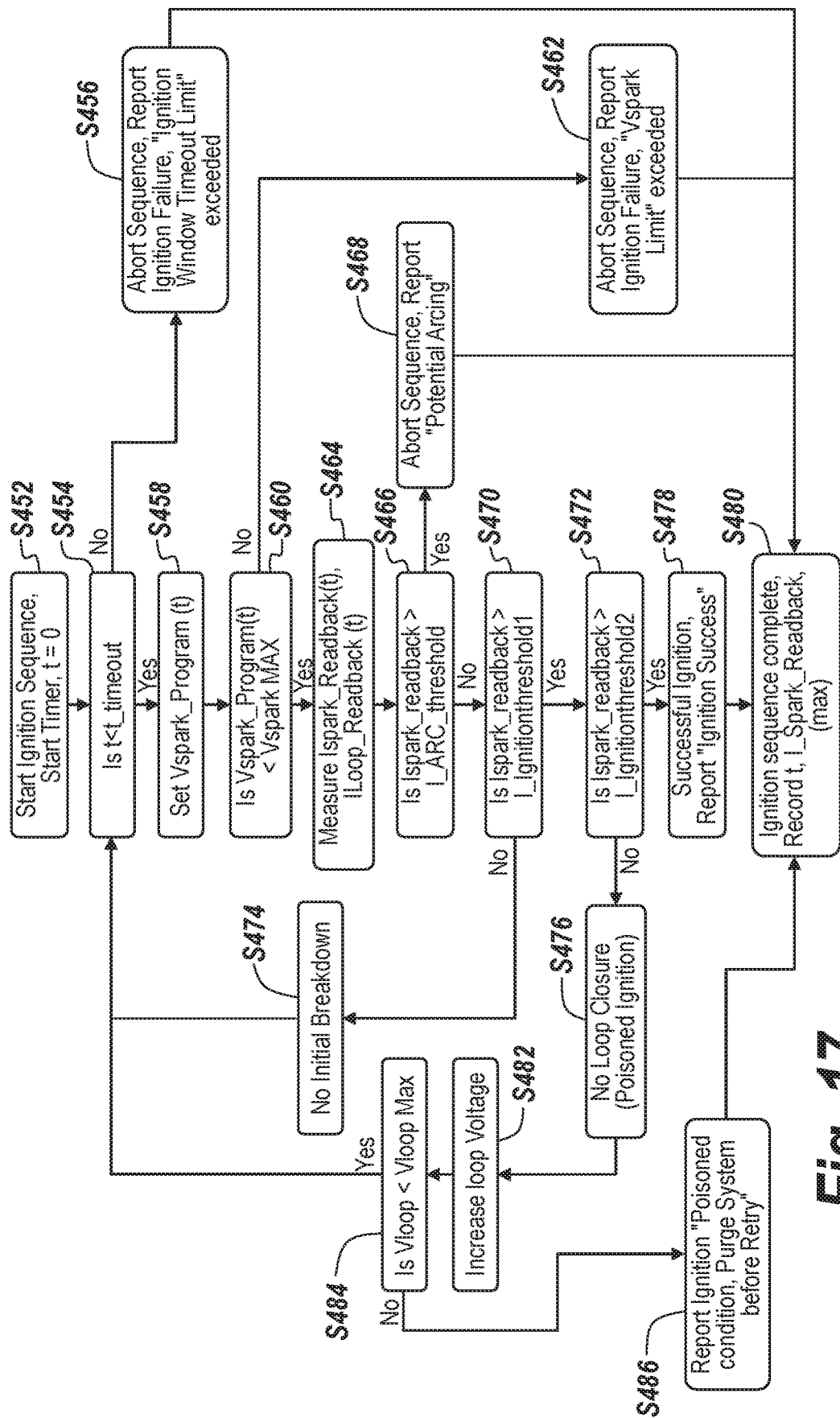
FIG. 17 includes a schematic logical flow diagram of another plasma ignition procedure, according to some exemplary embodiments.

FIG. 17 includes a schematic logical flow diagram of another plasma ignition procedure, according to some exemplary embodiments. Referring to FIG. 17, the ignition sequence starts by starting a timer at t=0, in step S452. Next, the time t is checked to determine if timeout has been reached, in step S454. In some exemplary embodiments, timeout can be set at 5-15 seconds. If timeout is reached, flow moves along No branch out of step S454 to step S456, where the sequence is aborted, and ignition failure is reported due to ignition window timeout limit exceeded. Flow then moves to step S480 where the ignition sequence is declared complete, the time to ignition t is recorded and the maximum ISpark_Readback reached during ignition is recorded. If timeout is not reached, then flow moves along the Yes branch out of step S454 to step S458, where the value of VSpark_Program is set, such as by obtaining the value from a look-up table. Next, in step S460, it is determined whether the value of VSpark_Program is less than a preset maximum VSpark value. If not, then flow moves along the No branch out of step S460 to step S462, where the sequence is aborted, and ignition failure is reported due to VSpark limit exceeded. Flow then moves to step S480 where the ignition sequence is declared complete, the time to ignition t is recorded and the maximum ISpark_Readback reached during ignition is recorded. If the maximum VSpark value is not exceeded, then flow moves along the Yes branch out of step S460 to step S464, where the ISpark_Readback and ILoop_Readback signals are measured. In step S466, it is determined whether ISpark_Readback exceeds a preset threshold current value I_Arc_Threshold for arcing. If the threshold is exceeded, then flow moves along the Yes branch out of step S466 to step S468, where the sequence is aborted, and potential arcing is reported. Flow then moves to step S480 where the ignition sequence is declared complete, the time to ignition t is recorded and the maximum ISpark_Readback reached during ignition is recorded. If the arcing threshold is not exceeded by ISpark_Readback, then flow moves along the No branch out of step S466 to step S470, where it is determined whether the current value of ISpark_Readback exceeds a first ignition current threshold I_Ignitionthreshold1. If not, then flow moves along the No branch out of step S470 to step S474, where it is concluded that no initial breakdown has yet occurred. Flow then returns back to step S454. If ISpark_Readback exceeds I-Ignitionthreshold1, then flow moves along the Yes branch out of step S470 to step S472, where it is determined whether ISpark_Readback exceeds a second ignition current threshold I_Ignitionthreshold2. If so, then flow moves along the Yes branch out of step S472 to step S478, where it is concluded and reported that a successful ignition has been achieved. Flow then moves to step S480 where the ignition sequence is declared complete, the time to ignition t is recorded and the maximum ISpark_Readback reached during ignition is recorded. If ISpark_Readback does not exceed the second ignition current threshold I_Ignitionthreshold2, then flow moves along the No branch out of step S472 to step S476, where it is concluded that no loop closure has occurred, and, therefore, that a poisoned ignition condition exists. Next, flow moves to step S482, where the loop voltage is increased, and then to step S484, where it is determined whether the new loop voltage is below the maximum allowable VLoop value. If not, then flow moves along the No branch out of step S484 to step S486, where an ignition poisoned condition is reported, and a notice is issued requiring purging of the system before a retry of ignition. Flow then moves to step S480 where the ignition sequence is declared complete, the time to ignition t is recorded and the maximum ISpark_Readback reached during ignition is recorded. If the new loop voltage is below the maximum allowable VLoop value, then flow moves along the Yes branch out of step S484 back to step S454.

Figure 18:
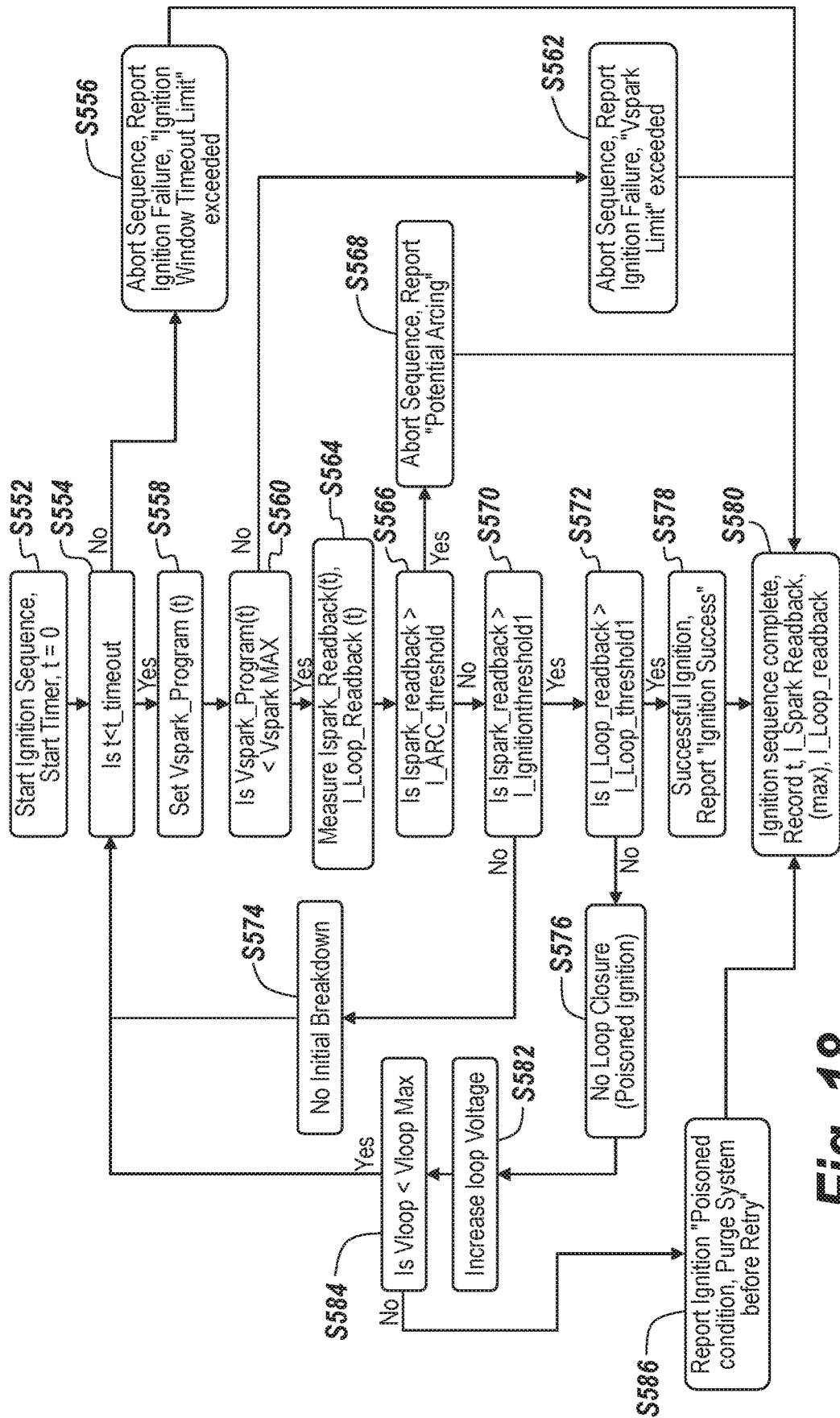
FIG. 18 includes a schematic logical flow diagram of another plasma ignition procedure, according to some exemplary embodiments.

FIG. 18 includes a schematic logical flow diagram of another plasma ignition procedure, according to some exemplary embodiments. Referring to FIG. 18, the ignition sequence starts by starting a timer at t=0, in step S552. Next, the time t is checked to determine if timeout has been reached, in step S554. In some exemplary embodiments, timeout can be set at 5-15 seconds. If timeout is reached, flow moves along No branch out of step S554 to step S556, where the sequence is aborted, and ignition failure is reported due to ignition window timeout limit exceeded. Next, flow moves to step 580, where the ignition sequence is declared complete, the time to ignition t is recorded and the maximum ISpark_Readback reached during ignition is recorded, and the value of ILoop_Readback is recorded. If timeout is not reached, then flow moves along the Yes branch out of step S554 to step S558, where the value of VSpark_Program is set, such as by obtaining the value from a look-up table. Next, in step S560, it is determined whether the value of VSpark_Program is less than a preset maximum VSpark value. If not, then flow moves along the No branch out of step S560 to step S562, where the sequence is aborted, and ignition failure is reported due to VSpark limit exceeded. Next, flow moves to step 580, where the ignition sequence is declared complete, the time to ignition t is recorded and the maximum ISpark_Readback reached during ignition is recorded, and the value of ILoop_Readback is recorded. If the maximum VSpark value is not exceeded, then flow moves along the Yes branch out of step S560 to step S564, where the ISpark_Readback and ILoop_Readback signals are measured. In step S566, it is determined whether ISpark_Readback exceeds a preset threshold current value I_Arc_Threshold for arcing. If the threshold is exceeded, then flow moves along the Yes branch out of step S566 to step S568, where the sequence is aborted, and potential arcing is reported. Next, flow moves to step 580, where the ignition sequence is declared complete, the time to ignition t is recorded and the maximum ISpark_Readback reached during ignition is recorded, and the value of ILoop_Readback is recorded. If the arcing threshold is not exceeded by ISpark_Readback, then flow moves along the No branch out of step S566 to step S570, where it is determined whether the current value of ISpark_Readback exceeds a first ignition current threshold I_Ignitionthreshold1. If not, then flow moves along the No branch out of step S570 to step S574, where it is concluded that no initial breakdown has yet occurred. Flow then returns back to step S554. If ISpark_Readback exceeds I-Ignitionthreshold1, then flow moves along the Yes branch out of step S570 to step S572, where it is determined whether ILoop_Readback exceeds a loop current threshold I_Loop_threshold1. If so, then flow moves along the Yes branch out of step S572 to step S578, where it is concluded and reported that a successful ignition has been achieved. Flow then moves to step S580 where the ignition sequence is declared complete, the time to ignition t is recorded and the maximum ISpark_Readback reached during ignition is recorded, and the value of ILoop_Readback is recorded. If ILoop_Readback does not exceed the loop current threshold I_Loop_threshold1, then flow moves along the No branch out of step S572 to step S576, where it is concluded that no loop closure has occurred, and, therefore, that a poisoned ignition condition exists. Next, flow moves to step S582, where the loop voltage is increased, and then to step S584, where it is determined whether the new loop voltage is below the maximum allowable VLoop value. If not, then flow moves along the No branch out of step S584 to step S586, where an ignition poisoned condition is reported, and a notice is issued requiring purging of the system before a retry of ignition. Next, flow moves to step 580, where the ignition sequence is declared complete, the time to ignition t is recorded and the maximum ISpark_Readback reached during ignition is recorded, and the value of ILoop_Readback is recorded. If the new loop voltage is below the maximum allowable VLoop value, then flow moves along the Yes branch out of step S584 back to step S554.

Figure 19:
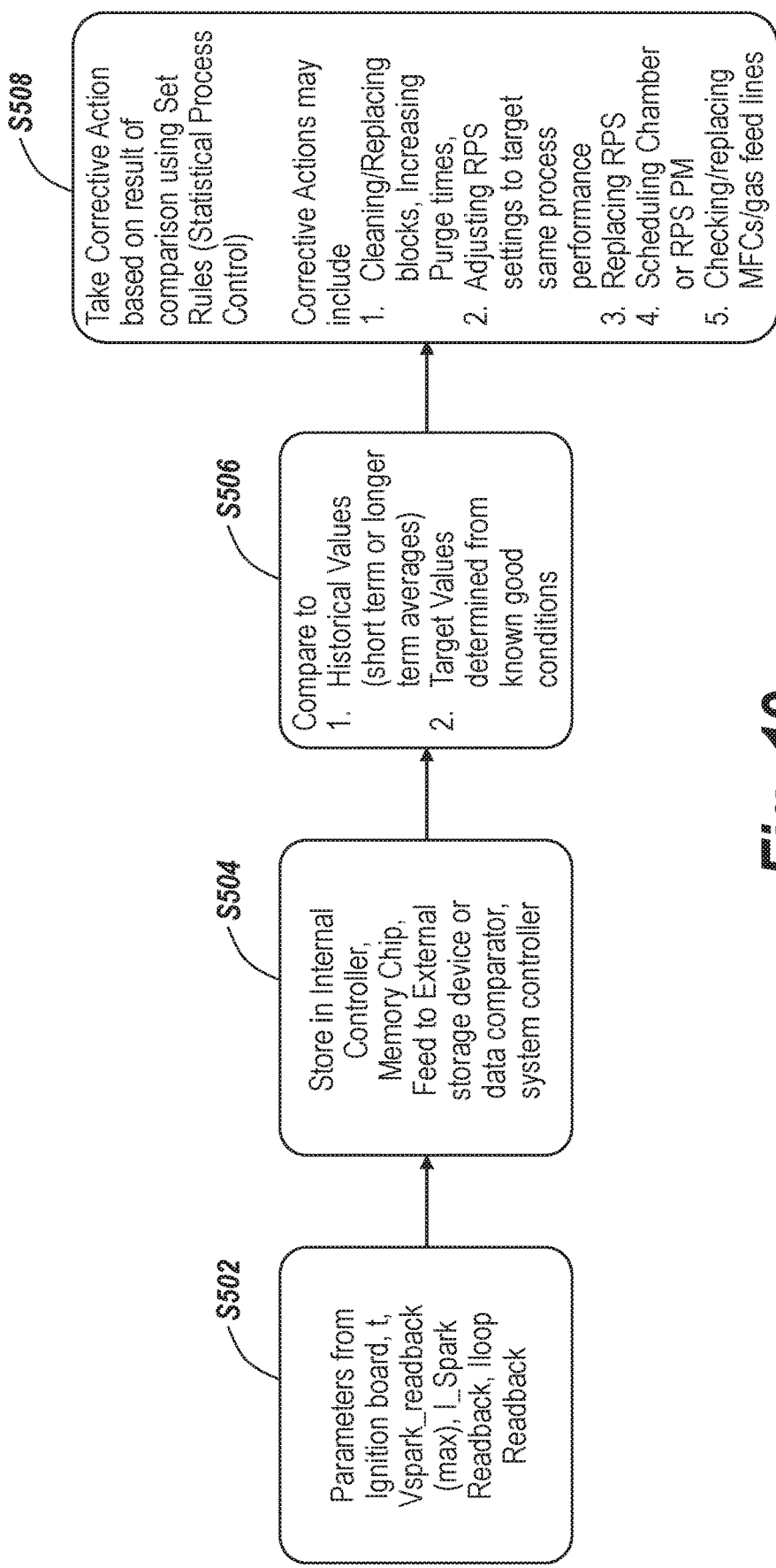
FIG. 19 includes a logical flow diagram illustrating the logical flow of a method of using plasma ignition parameters to monitor health and status of a plasma source, according to some exemplary embodiments.

As described above, the plasma ignition approach described herein in detail can be used in monitoring health and status of the overall system. FIG. 19 includes a logical flow diagram illustrating the logical flow of a method of using plasma ignition parameters to monitor health and status of a plasma source, according to some exemplary embodiments. Referring to FIG. 19, in step S502, parameters associated with the plasma ignition are read. The parameters include time t, maximum VSpark_Readback, ISpark_Readback, ILoop_Readback. In step 504, the parameters are stored in a memory and/or processing device, such as an internal controller, a semiconductor memory, an external storage device or data comparator, system controller, or any such device. In step S506, the present parameter values are compared to historical values, which can be short-term stored values or longer-term average values. Target values for the parameters are determined from known good conditions. In step S508, possible corrective actions are taken based on the comparisons in step S506. The corrective actions may include one or more of: (i) cleaning and/or replacing plasma block(s), (ii) increasing purge times, (iii) adjusting RPS settings to target same process performance, (iv) replacing RPS, (v) scheduling chamber or RPS preventive maintenance, (vi) checking and/or replacing MFCs/gas feed lines.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

The invention claimed is:

1. An apparatus for determining the health of a plasma system by monitoring an ignition process for igniting a plasma within a plasma confining volume, comprising:
    an ignition circuit for generating an ignition signal used to initiate the plasma ignition process;
    an input for applying the ignition signal between a biased region and a grounded region in the vicinity of the plasma confining volume;
    a sensor for sensing a parameter related to the ignition circuit; and
    at least one processing unit and a memory, the at least one the processing unit and memory configured to: (i) store the parameter sensed by the sensor, compare a present value of the parameter to historical values of the parameter, and determine a corrective action for the plasma system based on the comparison of the sensed parameter and historical sensed parameters, the corrective action to be implemented at a time when the ignition process is not being carried out.

2. The apparatus of claim 1, wherein the at least one processing unit and memory comprises an internal controller.

3. The apparatus of claim 1, wherein the at least one processing unit and memory comprises semiconductor memory.

4. The apparatus of claim 1, wherein the at least one processing unit and memory comprises an external memory device.

5. The apparatus of claim 1, wherein the at least one processing unit and memory comprises a data comparator.

6. The apparatus of claim 1, wherein the at least one processing unit and memory comprises a system controller.

7. The apparatus of claim 1 wherein the parameter is at least one of a voltage in the plasma confining volume and a current in the plasma confining volume.

8. A method of determining the health of a plasma system by monitoring an ignition process for igniting a plasma within a plasma confining volume, comprising:
    generating an ignition signal with an ignition circuit;
    applying the ignition signal between a biased region and a grounded region in the vicinity of the plasma confining volume;
    sensing a parameter related to the ignition circuit;
    comparing the sensed parameter to historical sensed parameters stored in at least one of a processing unit and memory; and
    determining at least one corrective action for the plasma system based on the comparison of the sensed parameter and historical sensed parameters, the corrective action to be implemented at a time when the ignition process is not being carried out.

9. The method of claim 8, wherein the at least one corrective action comprises cleaning plasma blocks within the plasma system.

10. The method of claim 8, wherein the at least one corrective action comprises replacing plasma blocks within the plasma system.

11. The method of claim 8, wherein the at least one corrective action comprises increasing purge times.

12. The method of claim 8, wherein the at least one corrective action comprises adjusting at least one remote plasma source performance setting.

13. The method of claim 8, wherein the at least one corrective action comprises replacing at least one remote plasma source used in the plasma system.

14. The method of claim 8, wherein the at least one corrective action comprises performing preventative maintenance to at least one remote plasma source used in the plasma system.

15. The method of claim 8, wherein the at least one corrective action comprises checking at least one of a mass flow controller and a gas feed line used in the plasma system.

16. The method of claim 8, wherein the at least one corrective action comprises replacing at least one of a mass flow controller and a gas feed line used in the plasma system.

\* \* \* \* \*